United States Patent
Agnew et al.

(10) Patent No.: US 12,431,349 B2
(45) Date of Patent: Sep. 30, 2025

(54) IN-SITU CONTROL OF FILM PROPERTIES DURING ATOMIC LAYER DEPOSITION

(71) Applicant: Lam Research Corporation, Fremont, CA (US)

(72) Inventors: Douglas Walter Agnew, Portland, OR (US); Joseph R. Abel, West Linn, OR (US); Ian John Curtin, Portland, OR (US); Purushottam Kumar, Hillsboro, OR (US); Awnish Gupta, Hillsboro, OR (US)

(73) Assignee: Lam Research Corporation, Fremont, CA (US)

( * ) Notice: Subject to any disclaimer, the term of this patent is extended or adjusted under 35 U.S.C. 154(b) by 901 days.

(21) Appl. No.: 17/596,096

(22) PCT Filed: Jun. 3, 2020

(86) PCT No.: PCT/US2020/035996
§ 371 (c)(1),
(2) Date: Dec. 2, 2021

(87) PCT Pub. No.: WO2020/247548
PCT Pub. Date: Dec. 10, 2020

(65) Prior Publication Data
US 2022/0238325 A1 Jul. 28, 2022

Related U.S. Application Data

(60) Provisional application No. 62/858,812, filed on Jun. 7, 2019.

(51) Int. Cl.
*H01L 21/02* (2006.01)
*C23C 16/40* (2006.01)
(Continued)

(52) U.S. Cl.
CPC ........ *H01L 21/0228* (2013.01); *C23C 16/401* (2013.01); *C23C 16/4554* (2013.01);
(Continued)

(58) Field of Classification Search
CPC .............. C23C 16/401; C23C 16/4554; C23C 16/45542
See application file for complete search history.

(56) References Cited

U.S. PATENT DOCUMENTS

| 4,500,563 A | 2/1985 | Ellenberger et al. |
| 5,094,984 A | 3/1992 | Liu et al. |

(Continued)

FOREIGN PATENT DOCUMENTS

| CN | 1552097 A | 12/2004 |
| CN | 1732288 A | 2/2006 |

(Continued)

OTHER PUBLICATIONS

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

(Continued)

*Primary Examiner* — Michael G Miller
(74) *Attorney, Agent, or Firm* — Weaver Austin Villeneuve & Sampson LLP

(57) ABSTRACT

Methods of providing control of film properties during atomic layer deposition using intermittent plasma treatment in-situ are provided herein. Methods include modulating gas flow rate ratios used to generate plasma during intermittent plasma treatment, toggling plasma power, and modulating chamber pressure.

9 Claims, 9 Drawing Sheets

(51) Int. Cl.
*C23C 16/455* (2006.01)
*H01J 37/32* (2006.01)

(52) U.S. Cl.
CPC .... *C23C 16/45542* (2013.01); *H01J 37/3244* (2013.01); *H01L 21/02164* (2013.01); *H01L 21/02274* (2013.01); *H01J 2237/332* (2013.01)

(56) References Cited

U.S. PATENT DOCUMENTS

| | | | |
|---|---|---|---|
| 5,223,443 | A | 6/1993 | Chinn et al. |
| 5,230,929 | A | 7/1993 | Caporiccio et al. |
| 5,318,928 | A | 6/1994 | Gegenwart et al. |
| 5,496,608 | A | 3/1996 | Matsuda et al. |
| 5,593,914 | A | 1/1997 | Evans, Jr. et al. |
| 5,670,432 | A | 9/1997 | Tsai |
| 5,856,003 | A | 1/1999 | Chiu |
| 5,863,339 | A | 1/1999 | Usami |
| 5,874,368 | A | 2/1999 | Laxman et al. |
| 5,916,365 | A | 6/1999 | Sherman |
| 5,932,286 | A | 8/1999 | Beinglass et al. |
| 6,069,058 | A | 5/2000 | Hong |
| 6,100,202 | A | 8/2000 | Lin et al. |
| 6,156,149 | A | 12/2000 | Cheung et al. |
| 6,218,293 | B1 | 4/2001 | Kraus et al. |
| 6,270,572 | B1 | 8/2001 | Kim et al. |
| 6,346,741 | B1 | 2/2002 | Van Buskirk et al. |
| 6,391,803 | B1 | 5/2002 | Kim et al. |
| 6,399,221 | B1 | 6/2002 | Marks et al. |
| 6,416,822 | B1 | 7/2002 | Chiang et al. |
| 6,428,859 | B1 | 8/2002 | Chiang et al. |
| 6,448,192 | B1 | 9/2002 | Kaushik |
| 6,465,272 | B1 | 10/2002 | Davis, Jr. et al. |
| 6,468,924 | B2 | 10/2002 | Lee et al. |
| 6,482,726 | B1 | 11/2002 | Aminpur et al. |
| 6,509,601 | B1 | 1/2003 | Lee et al. |
| 6,528,430 | B2 | 3/2003 | Kwan et al. |
| 6,551,893 | B1 | 4/2003 | Zheng et al. |
| 6,569,501 | B2 | 5/2003 | Chiang et al. |
| 6,576,053 | B1 | 6/2003 | Kim et al. |
| 6,602,784 | B2 | 8/2003 | Sneh |
| 6,632,478 | B2 | 10/2003 | Gaillard et al. |
| 6,645,574 | B1 | 11/2003 | Lee et al. |
| 6,689,220 | B1 | 2/2004 | Nguyen |
| 6,723,595 | B2 | 4/2004 | Park |
| 6,730,614 | B1 | 5/2004 | Lim et al. |
| 6,743,738 | B2 | 6/2004 | Todd |
| 6,756,318 | B2 | 6/2004 | Nguyen et al. |
| 6,765,303 | B1 | 7/2004 | Krivokapic et al. |
| 6,809,421 | B1 | 10/2004 | Hayasaka et al. |
| 6,828,218 | B2 | 12/2004 | Kim et al. |
| 6,835,417 | B2 | 12/2004 | Saenger et al. |
| 6,861,356 | B2 | 3/2005 | Matsuse et al. |
| 6,884,466 | B2 | 4/2005 | Kaloyeros et al. |
| 6,930,058 | B2 | 8/2005 | Hill et al. |
| 6,930,060 | B2 | 8/2005 | Chou et al. |
| 6,943,092 | B2 | 9/2005 | Kim |
| 6,962,876 | B2 | 11/2005 | Ahn et al. |
| 6,987,240 | B2 | 1/2006 | Jennings et al. |
| 7,001,844 | B2 | 2/2006 | Chakravarti et al. |
| 7,041,335 | B2 | 5/2006 | Chung |
| 7,077,904 | B2 | 7/2006 | Cho et al. |
| 7,081,271 | B2 | 7/2006 | Chung et al. |
| 7,097,886 | B2 | 8/2006 | Moghadam et al. |
| 7,109,129 | B1 | 9/2006 | Papasouliotis |
| 7,115,166 | B2 | 10/2006 | Vaartstra et al. |
| 7,115,528 | B2 | 10/2006 | Vaartstra et al. |
| 7,122,222 | B2 | 10/2006 | Xiao et al. |
| 7,122,464 | B2 | 10/2006 | Vaartstra |
| 7,125,815 | B2 | 10/2006 | Vaartstra |
| 7,132,353 | B1 | 11/2006 | Xia et al. |
| 7,141,278 | B2 | 11/2006 | Koh et al. |
| 7,148,155 | B1 | 12/2006 | Tarafdar et al. |
| 7,151,039 | B2 | 12/2006 | Lee et al. |
| 7,172,792 | B2 | 2/2007 | Wang et al. |
| 7,176,084 | B2 | 2/2007 | Lee et al. |
| 7,205,187 | B2 | 4/2007 | Leith et al. |
| 7,211,525 | B1 | 5/2007 | Shanker et al. |
| 7,223,649 | B2 | 5/2007 | Oh et al. |
| 7,235,484 | B2 | 6/2007 | Nguyen et al. |
| 7,241,686 | B2 | 7/2007 | Marcadal et al. |
| 7,244,668 | B2 | 7/2007 | Kim |
| 7,250,083 | B2 | 7/2007 | Sneh |
| 7,259,050 | B2 | 8/2007 | Chen et al. |
| 7,261,919 | B2 | 8/2007 | Mehregany et al. |
| 7,294,582 | B2 | 11/2007 | Haverkort et al. |
| 7,297,641 | B2 | 11/2007 | Todd et al. |
| 7,300,885 | B2 | 11/2007 | Hasebe et al. |
| 7,314,835 | B2 | 1/2008 | Ishizaka et al. |
| 7,341,959 | B2 | 3/2008 | Brcka |
| 7,351,668 | B2 | 4/2008 | Chou et al. |
| 7,361,538 | B2 | 4/2008 | Luan et al. |
| 7,361,611 | B2 | 4/2008 | Chakravarti et al. |
| 7,390,743 | B2 | 6/2008 | Shin |
| 7,393,561 | B2 | 7/2008 | Paranjpe |
| 7,399,388 | B2 | 7/2008 | Moghadam et al. |
| 7,419,888 | B2 | 9/2008 | Yang et al. |
| 7,435,454 | B2 | 10/2008 | Brcka |
| 7,435,684 | B1 | 10/2008 | Lang et al. |
| 7,462,571 | B2 | 12/2008 | Hasebe et al. |
| 7,482,247 | B1 | 1/2009 | Papasouliotis et al. |
| 7,488,694 | B2 | 2/2009 | Kim et al. |
| 7,507,676 | B2 | 3/2009 | Chou et al. |
| 7,510,984 | B2 | 3/2009 | Saito et al. |
| 7,521,331 | B2 | 4/2009 | Park et al. |
| 7,524,762 | B2 | 4/2009 | Marcadal et al. |
| 7,544,615 | B2 | 6/2009 | Vaartstra |
| 7,572,052 | B2 | 8/2009 | Ravi et al. |
| 7,592,231 | B2 | 9/2009 | Cheng et al. |
| 7,595,010 | B2 | 9/2009 | Chakravarti et al. |
| 7,601,648 | B2 | 10/2009 | Chua et al. |
| 7,615,438 | B2 | 11/2009 | Ahn et al. |
| 7,615,449 | B2 | 11/2009 | Chung et al. |
| 7,622,369 | B1 | 11/2009 | Lee et al. |
| 7,622,383 | B2 | 11/2009 | Kim et al. |
| 7,625,820 | B1 | 12/2009 | Papasouliotis et al. |
| 7,629,267 | B2 | 12/2009 | Wan et al. |
| 7,632,757 | B2 | 12/2009 | Matsuura |
| 7,633,125 | B2 | 12/2009 | Lu et al. |
| 7,638,170 | B2 | 12/2009 | Li |
| 7,645,484 | B2 | 1/2010 | Ishizaka |
| 7,651,729 | B2 | 1/2010 | Kim et al. |
| 7,651,730 | B2 | 1/2010 | Hasebe |
| 7,651,953 | B2 | 1/2010 | Todd et al. |
| 7,651,959 | B2 | 1/2010 | Fukazawa et al. |
| 7,682,657 | B2 | 3/2010 | Sherman |
| 7,687,409 | B2 | 3/2010 | Ahn et al. |
| 7,713,592 | B2 | 5/2010 | Nguyen et al. |
| 7,745,346 | B2 | 6/2010 | Hausmann et al. |
| 7,758,920 | B2 | 7/2010 | Hasebe et al. |
| 7,776,733 | B2 | 8/2010 | Hasegawa |
| 7,790,633 | B1 | 9/2010 | Tarafdar et al. |
| 7,825,039 | B2 | 11/2010 | Takahashi et al. |
| 7,863,190 | B1 | 1/2011 | Papasouliotis et al. |
| 7,906,168 | B2 | 3/2011 | Hasebe et al. |
| 7,919,416 | B2 | 4/2011 | Lee et al. |
| 7,923,068 | B2 | 4/2011 | Dickey et al. |
| 7,923,378 | B2 | 4/2011 | Hasebe et al. |
| 7,959,985 | B2 | 6/2011 | Ishizaka et al. |
| 7,964,241 | B2 | 6/2011 | Hasebe et al. |
| 7,964,513 | B2 | 6/2011 | Todd et al. |
| 7,972,980 | B2 | 7/2011 | Lee et al. |
| 7,981,473 | B2 | 7/2011 | Kim et al. |
| 7,989,365 | B2 | 8/2011 | Park et al. |
| 8,034,673 | B2 | 10/2011 | Kadonaga et al. |
| 8,080,290 | B2 | 12/2011 | Hasebe et al. |
| 8,101,531 | B1 | 1/2012 | Li et al. |
| 8,119,424 | B2 | 2/2012 | Mather et al. |
| 8,119,544 | B2 | 2/2012 | Hasebe et al. |
| 8,133,797 | B2 | 3/2012 | Van Schravendijk et al. |
| 8,178,448 | B2 | 5/2012 | Nodera et al. |
| 8,227,032 | B2 | 7/2012 | Dussarrat et al. |
| 8,257,789 | B2 | 9/2012 | Matsunaga et al. |
| 8,278,224 | B1 | 10/2012 | Mui et al. |
| 8,334,218 | B2 | 12/2012 | Van Nooten et al. |

(56) References Cited

U.S. PATENT DOCUMENTS

| | | |
|---|---|---|
| 8,338,312 B2 | 12/2012 | Sato et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B1 | 2/2014 | LaVoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,802,882 B2 | 8/2014 | Wang et al. |
| 8,829,636 B2 | 9/2014 | Ohchi et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | LaVoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,406,693 B1 | 8/2016 | Pang et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | LaVoie et al. |
| 9,627,221 B1 | 4/2017 | Zaitsu et al. |
| 9,673,041 B2 | 6/2017 | Swaminathan et al. |
| 9,685,320 B2 | 6/2017 | Kang et al. |
| 9,773,643 B1 | 9/2017 | Singhal et al. |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 9,997,357 B2 | 6/2018 | Arghavani et al. |
| 10,008,428 B2 | 6/2018 | Kang et al. |
| 10,037,884 B2 | 7/2018 | Ou et al. |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 10,269,559 B2 | 4/2019 | Abel et al. |
| 10,361,076 B2 | 7/2019 | Kang et al. |
| 10,373,806 B2 | 8/2019 | Singhal et al. |
| 10,559,468 B2 | 2/2020 | Arghavani et al. |
| 10,679,848 B2 | 6/2020 | Kumar et al. |
| 10,741,458 B2 | 8/2020 | Kang et al. |
| 10,804,099 B2 | 10/2020 | Henri et al. |
| 10,957,514 B2 | 3/2021 | Singhal et al. |
| 11,133,180 B2 | 9/2021 | Kang et al. |
| 12,040,181 B2 | 7/2024 | Soe et al. |
| 2001/0028922 A1 | 10/2001 | Sandhu |
| 2002/0066411 A1 | 6/2002 | Chiang et al. |
| 2002/0076507 A1 | 6/2002 | Chiang et al. |
| 2002/0153101 A1 | 10/2002 | Nguyen et al. |
| 2002/0175393 A1 | 11/2002 | Baum et al. |
| 2003/0008070 A1 | 1/2003 | Seutter et al. |
| 2003/0008492 A1 | 1/2003 | Jung et al. |
| 2003/0024477 A1 | 2/2003 | Okuda et al. |
| 2003/0034244 A1 | 2/2003 | Yasar et al. |
| 2003/0092280 A1 | 5/2003 | Lee et al. |
| 2003/0108674 A1 | 6/2003 | Chung et al. |
| 2003/0116421 A1 | 6/2003 | Xu et al. |
| 2003/0134038 A1 | 7/2003 | Paranjpe |
| 2003/0143839 A1 | 7/2003 | Raaijmakers et al. |
| 2003/0200917 A1 | 10/2003 | Vaartstra |
| 2003/0211757 A1 | 11/2003 | Gondhalekar et al. |
| 2003/0216006 A1 | 11/2003 | Li et al. |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0096582 A1 | 5/2004 | Wang et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0151845 A1 | 8/2004 | Nguyen et al. |
| 2004/0157472 A1 | 8/2004 | Sugino et al. |
| 2004/0171280 A1 | 9/2004 | Conley, Jr. et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0009368 A1 | 1/2005 | Vaartstra |
| 2005/0042865 A1 | 2/2005 | Cabral, Jr. et al. |
| 2005/0079661 A1 | 4/2005 | Cho et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0276930 A1 | 12/2005 | Gates et al. |
| 2005/0282346 A1 | 12/2005 | Barth et al. |
| 2005/0287775 A1 | 12/2005 | Hasebe et al. |
| 2006/0003557 A1 | 1/2006 | Cabral, Jr. et al. |
| 2006/0009041 A1 | 1/2006 | Iyer et al. |
| 2006/0014384 A1 | 1/2006 | Lee et al. |
| 2006/0030148 A1 | 2/2006 | Seutter et al. |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0105106 A1 | 5/2006 | Balseanu et al. |
| 2006/0165890 A1 | 7/2006 | Kaushal et al. |
| 2006/0178019 A1 | 8/2006 | Senzaki et al. |
| 2006/0183055 A1 | 8/2006 | O'Neill et al. |
| 2006/0199357 A1 | 9/2006 | Wan et al. |
| 2006/0216418 A1 | 9/2006 | Matsuura |
| 2006/0228868 A1 | 10/2006 | Ahn et al. |
| 2006/0281254 A1 | 12/2006 | Lee et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0032047 A1 | 2/2007 | Hasebe et al. |
| 2007/0048455 A1 | 3/2007 | Koh et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0119370 A1 | 5/2007 | Ma et al. |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0238301 A1 | 10/2007 | Cabral et al. |
| 2007/0243693 A1 | 10/2007 | Nemani et al. |
| 2007/0245959 A1 | 10/2007 | Paterson et al. |
| 2007/0251444 A1 | 11/2007 | Gros-Jean et al. |
| 2007/0259110 A1 | 11/2007 | Mahajani et al. |
| 2007/0281495 A1 | 12/2007 | Mallick et al. |
| 2007/0298585 A1 | 12/2007 | Lubomirsky et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |

(56) References Cited

U.S. PATENT DOCUMENTS

| | | |
|---|---|---|
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0182417 A1 | 7/2008 | Collins et al. |
| 2008/0207007 A1 | 8/2008 | Thridandam et al. |
| 2008/0213479 A1 | 9/2008 | Chou et al. |
| 2008/0233762 A1 | 9/2008 | Hong |
| 2008/0242077 A1 | 10/2008 | Clark |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0308526 A1 | 12/2008 | Pandhumsoporn et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2009/0286381 A1 | 11/2009 | Van Schravendijk et al. |
| 2009/0286402 A1 | 11/2009 | Xia et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096687 A1 | 4/2010 | Balseanu et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0126667 A1 | 5/2010 | Yin et al. |
| 2010/0136260 A1 | 6/2010 | Matsunaga et al. |
| 2010/0136313 A1 | 6/2010 | Shimizu et al. |
| 2010/0144162 A1 | 6/2010 | Lee et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0244114 A1 | 9/2010 | Konno et al. |
| 2010/0255218 A1 | 10/2010 | Oka et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0121354 A1 | 5/2011 | Schmid et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0159673 A1 | 6/2011 | Hanawa et al. |
| 2011/0171775 A1 | 7/2011 | Yamamoto et al. |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0262642 A1 | 10/2011 | Xiao et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0122302 A1 | 5/2012 | Weidman et al. |
| 2012/0161405 A1 | 6/2012 | Mohn et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0258261 A1 | 10/2012 | Reddy et al. |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0043512 A1 | 2/2013 | Huang et al. |
| 2013/0058161 A1 | 3/2013 | Yamanaka et al. |
| 2013/0058162 A1 | 3/2013 | Yamanaka et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0129940 A1 | 5/2013 | Xiao et al. |
| 2013/0164942 A1 | 6/2013 | Kato et al. |
| 2013/0189854 A1 | 7/2013 | Hausmann et al. |
| 2013/0196082 A1 | 8/2013 | Spence et al. |
| 2013/0196516 A1 | 8/2013 | Lavoie et al. |
| 2013/0252437 A1 | 9/2013 | Sano et al. |
| 2013/0302980 A1 | 11/2013 | Chandrashekar et al. |
| 2013/0309415 A1 | 11/2013 | Swaminathan et al. |
| 2013/0319329 A1 | 12/2013 | Li et al. |
| 2013/0323923 A1 | 12/2013 | Koehler et al. |
| 2013/0330935 A1 | 12/2013 | Varadarajan |
| 2013/0344248 A1 | 12/2013 | Clark |
| 2014/0030444 A1 | 1/2014 | Swaminathan et al. |
| 2014/0049162 A1 | 2/2014 | Thomas et al. |
| 2014/0051262 A9 | 2/2014 | Lavoie et al. |
| 2014/0087066 A1 | 3/2014 | Wang et al. |
| 2014/0094035 A1 | 4/2014 | Ji et al. |
| 2014/0106574 A1 | 4/2014 | Kang et al. |
| 2014/0113457 A1* | 4/2014 | Sims ............... H01L 21/02167 438/778 |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0158580 A1 | 6/2014 | Xiao et al. |
| 2014/0170853 A1 | 6/2014 | Shamma et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0239462 A1 | 8/2014 | Shamma et al. |
| 2014/0262038 A1 | 9/2014 | Wang et al. |
| 2014/0264555 A1 | 9/2014 | Ahn et al. |

(56) References Cited

U.S. PATENT DOCUMENTS

| | | |
|---|---|---|
| 2014/0273428 A1 | 9/2014 | Shero et al. |
| 2014/0273528 A1 | 9/2014 | Niskanen et al. |
| 2014/0295084 A1 | 10/2014 | Shirai et al. |
| 2014/0302686 A1 | 10/2014 | Pan et al. |
| 2015/0024592 A1 | 1/2015 | Chandrashekar et al. |
| 2015/0031218 A1 | 1/2015 | Karakawa |
| 2015/0041867 A1 | 2/2015 | Han |
| 2015/0048740 A1 | 2/2015 | Valcore, Jr. et al. |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1* | 1/2016 | Kang ............... H01J 37/32917 438/789 |
| 2016/0064211 A1 | 3/2016 | Swaminathan et al. |
| 2016/0079037 A1 | 3/2016 | Hirano et al. |
| 2016/0079054 A1 | 3/2016 | Chen et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0190008 A1 | 6/2016 | Chandrashekar et al. |
| 2016/0240428 A1 | 8/2016 | Tung et al. |
| 2016/0251756 A1 | 9/2016 | Lansalot-Matras et al. |
| 2016/0260584 A1 | 9/2016 | Marakhtanov et al. |
| 2016/0293385 A1 | 10/2016 | Kapoor et al. |
| 2016/0293398 A1 | 10/2016 | Danek et al. |
| 2016/0293838 A1 | 10/2016 | Swaminathan et al. |
| 2016/0322212 A1 | 11/2016 | Kamakura et al. |
| 2016/0322215 A1 | 11/2016 | Shaikh |
| 2016/0322371 A1 | 11/2016 | Yonemochi |
| 2016/0329206 A1 | 11/2016 | Kumar et al. |
| 2016/0329423 A1 | 11/2016 | Kawahara et al. |
| 2016/0336178 A1 | 11/2016 | Swaminathan et al. |
| 2016/0340782 A1 | 11/2016 | Chandrasekharan et al. |
| 2016/0343580 A1 | 11/2016 | Hudson |
| 2016/0365425 A1 | 12/2016 | Chen et al. |
| 2016/0379826 A9 | 12/2016 | Arghavani et al. |
| 2017/0009346 A1 | 1/2017 | Kumar et al. |
| 2017/0062204 A1 | 3/2017 | Suzuki et al. |
| 2017/0092735 A1 | 3/2017 | Hashemi et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0170026 A1 | 6/2017 | Hudson et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323786 A1 | 11/2017 | Kang et al. |
| 2017/0323803 A1 | 11/2017 | Van Schravendijk et al. |
| 2018/0005801 A1 | 1/2018 | Singhal et al. |
| 2018/0005814 A1 | 1/2018 | Kumar et al. |
| 2018/0047645 A1 | 2/2018 | Varadarajan et al. |
| 2018/0061628 A1 | 3/2018 | Ou et al. |
| 2018/0108518 A1 | 4/2018 | Noro et al. |
| 2018/0138028 A1 | 5/2018 | Henri et al. |
| 2018/0223429 A1 | 8/2018 | Fukazawa et al. |
| 2018/0247875 A1 | 8/2018 | Kang et al. |
| 2018/0269061 A1 | 9/2018 | Arghavani et al. |
| 2018/0323057 A1 | 11/2018 | Kumar et al. |
| 2019/0024233 A1 | 1/2019 | Kumar et al. |
| 2019/0055645 A1 | 2/2019 | Li et al. |
| 2019/0080903 A1 | 3/2019 | Abel et al. |
| 2019/0279866 A1 | 9/2019 | Pore |
| 2019/0284694 A1 | 9/2019 | Knisley et al. |
| 2019/0311897 A1 | 10/2019 | Kang et al. |
| 2019/0385820 A1 | 12/2019 | Singhal et al. |
| 2019/0385850 A1 | 12/2019 | Arghavani et al. |
| 2021/0301400 A1 | 9/2021 | Lee et al. |
| 2022/0059348 A1 | 2/2022 | Kang et al. |
| 2022/0208543 A1 | 6/2022 | Soe et al. |
| 2024/0332007 A1 | 10/2024 | Soe et al. |

FOREIGN PATENT DOCUMENTS

| | | |
|---|---|---|
| CN | 1768158 A | 5/2006 |
| CN | 1841676 A | 10/2006 |
| CN | 1926668 A | 3/2007 |
| CN | 101006195 A | 7/2007 |
| CN | 101044598 A | 9/2007 |
| CN | 101064272 A | 10/2007 |
| CN | 101255548 A | 9/2008 |
| CN | 101328578 A | 12/2008 |
| CN | 101378007 A | 3/2009 |
| CN | 101416293 A | 4/2009 |
| CN | 101442004 A | 5/2009 |
| CN | 101535524 A | 9/2009 |
| CN | 101736326 A | 6/2010 |
| CN | 101743341 A | 6/2010 |
| CN | 101889331 A | 11/2010 |
| CN | 102005462 A | 4/2011 |
| CN | 102191479 A | 9/2011 |
| CN | 102224573 A | 10/2011 |
| CN | 102471885 A | 5/2012 |
| CN | 102687249 A | 9/2012 |
| CN | 102906304 A | 1/2013 |
| CN | 103137864 A | 6/2013 |
| CN | 103572259 A | 2/2014 |
| CN | 103918068 A | 7/2014 |
| CN | 103928396 A | 7/2014 |
| CN | 104272441 A | 1/2015 |
| CN | 104517892 A | 4/2015 |
| CN | 104576506 A | 4/2015 |
| CN | 105391427 A | 3/2016 |
| CN | 205164805 U | 4/2016 |
| CN | 105609471 A | 5/2016 |
| CN | 105719954 A | 6/2016 |
| CN | 106449360 A | 2/2017 |
| CN | 106548923 A | 3/2017 |
| CN | 109478497 A | 3/2019 |
| EP | 0277766 A2 | 8/1988 |
| EP | 0541212 A2 | 5/1993 |
| EP | 1081754 A2 | 3/2001 |
| EP | 1703552 A2 | 9/2006 |
| EP | 2278046 A1 | 1/2011 |
| JP | S4843472 A | 6/1973 |
| JP | H0293071 A | 4/1990 |
| JP | H0311635 A | 1/1991 |
| JP | H05226279 A | 9/1993 |
| JP | H0684812 A | 3/1994 |
| JP | H06177120 A | 6/1994 |
| JP | H0781271 A | 3/1995 |
| JP | H07176084 A | 7/1995 |
| JP | H09102494 A | 4/1997 |
| JP | H09167755 A | 6/1997 |
| JP | H09219401 A | 8/1997 |
| JP | H1098032 A | 4/1998 |
| JP | H10189467 A | 7/1998 |
| JP | H11172439 A | 6/1999 |
| JP | 2001274404 A | 10/2001 |
| JP | 2001338922 A | 12/2001 |
| JP | 2002009072 A | 1/2002 |
| JP | 2002134497 A | 5/2002 |
| JP | 2002164345 A | 6/2002 |
| JP | 2002539640 A | 11/2002 |
| JP | 2003110021 A | 4/2003 |
| JP | 2003197615 A | 7/2003 |
| JP | 2005136300 A | 5/2005 |
| JP | 2005210076 A | 8/2005 |
| JP | 2005310927 A | 11/2005 |
| JP | 2006060091 A | 3/2006 |

(56) References Cited

FOREIGN PATENT DOCUMENTS

| | | |
|---|---|---|
| JP | 2006135029 A | 5/2006 |
| JP | 2006286813 A | 10/2006 |
| JP | 2006303431 A | 11/2006 |
| JP | 2007103950 A | 4/2007 |
| JP | 2007165883 A | 6/2007 |
| JP | 2007180362 A | 7/2007 |
| JP | 2007189173 A | 7/2007 |
| JP | 2007521658 A | 8/2007 |
| JP | 2007287889 A | 11/2007 |
| JP | 2007287890 A | 11/2007 |
| JP | 2008500742 A | 1/2008 |
| JP | 2008506262 A | 2/2008 |
| JP | 2008060455 A | 3/2008 |
| JP | 2008109093 A | 5/2008 |
| JP | 2008517479 A | 5/2008 |
| JP | 2008522405 A | 6/2008 |
| JP | 2008160123 A | 7/2008 |
| JP | 2008182199 A | 8/2008 |
| JP | 2008199052 A | 8/2008 |
| JP | 2008258591 A | 10/2008 |
| JP | 2008294260 A | 12/2008 |
| JP | 2008306093 A | 12/2008 |
| JP | 2009065203 A | 3/2009 |
| JP | 2009170823 A | 7/2009 |
| JP | 4364320 B2 | 11/2009 |
| JP | 2009540128 A | 11/2009 |
| JP | 2010010497 A | 1/2010 |
| JP | 2010043081 A | 2/2010 |
| JP | 2010103484 A | 5/2010 |
| JP | 2010118664 A | 5/2010 |
| JP | 2010152136 A | 7/2010 |
| JP | 2010183069 A | 8/2010 |
| JP | 2010530127 A | 9/2010 |
| JP | 2010245518 A | 10/2010 |
| JP | 2010251654 A | 11/2010 |
| JP | 2010283388 A | 12/2010 |
| JP | 2010539730 A | 12/2010 |
| JP | 2011023576 A | 2/2011 |
| JP | 2011023655 A | 2/2011 |
| JP | 2011035366 A | 2/2011 |
| JP | 2011054968 A | 3/2011 |
| JP | 2011067744 A | 4/2011 |
| JP | 2011187934 A | 9/2011 |
| JP | 2012506640 A | 3/2012 |
| JP | 2012169658 A | 9/2012 |
| JP | 2012199306 A | 10/2012 |
| JP | 2013058521 A | 3/2013 |
| JP | 2013102130 A | 5/2013 |
| JP | 5225081 B2 | 7/2013 |
| JP | 2013166965 A | 8/2013 |
| JP | 2013196822 A | 9/2013 |
| JP | 2013225655 A | 10/2013 |
| JP | 2013240042 A | 11/2013 |
| JP | 2014112668 A | 6/2014 |
| JP | 2014532304 A | 12/2014 |
| JP | 2015029097 A | 2/2015 |
| JP | 2015512568 A | 4/2015 |
| JP | 2016063232 A | 4/2016 |
| JP | 2016066794 A | 4/2016 |
| JP | 2018011050 A | 1/2018 |
| KR | 20010111448 A | 12/2001 |
| KR | 20020048617 A | 6/2002 |
| KR | 100356473 B1 | 10/2002 |
| KR | 20040001036 A | 1/2004 |
| KR | 20040096380 A | 11/2004 |
| KR | 20040097219 A | 11/2004 |
| KR | 20050035354 A | 4/2005 |
| KR | 20060023137 A | 3/2006 |
| KR | 20060056883 A | 5/2006 |
| KR | 100721503 B1 | 5/2007 |
| KR | 20070060104 A | 6/2007 |
| KR | 20070066945 A | 6/2007 |
| KR | 100734748 B1 | 7/2007 |
| KR | 20070088512 A | 8/2007 |
| KR | 20080052499 A | 6/2008 |
| KR | 20080079625 A | 9/2008 |
| KR | 100861851 B1 | 10/2008 |
| KR | 20090057665 A | 6/2009 |
| KR | 20090080019 A | 7/2009 |
| KR | 20090081396 A | 7/2009 |
| KR | 20090116433 A | 11/2009 |
| KR | 20100106576 A | 10/2010 |
| KR | 20100117205 A | 11/2010 |
| KR | 20100124807 A | 11/2010 |
| KR | 20100133377 A | 12/2010 |
| KR | 20110016916 A | 2/2011 |
| KR | 20110034822 A | 4/2011 |
| KR | 20110086090 A | 7/2011 |
| KR | 20120011825 A | 2/2012 |
| KR | 20130035880 A | 4/2013 |
| KR | 20130056608 A | 5/2013 |
| KR | 20130057409 A | 5/2013 |
| KR | 20130062256 A | 6/2013 |
| KR | 20130115261 A | 10/2013 |
| KR | 20130135087 A | 12/2013 |
| KR | 20130135261 A | 12/2013 |
| KR | 20140060253 A | 5/2014 |
| KR | 20140079431 A | 6/2014 |
| KR | 20140126241 A | 10/2014 |
| KR | 20140141686 A | 12/2014 |
| KR | 20150025224 A | 3/2015 |
| KR | 20150037662 A | 4/2015 |
| KR | 20160011149 A | 1/2016 |
| KR | 20170007177 A | 1/2017 |
| KR | 101762978 B1 | 7/2017 |
| KR | 20170103117 A | 9/2017 |
| KR | 20180028016 A | 3/2018 |
| SG | 188537 A1 | 4/2013 |
| TW | 483103 B | 4/2002 |
| TW | 200701341 A | 1/2007 |
| TW | 200721306 A | 6/2007 |
| TW | 201009942 A | 3/2010 |
| TW | 201042706 A | 12/2010 |
| TW | 201113934 A | 4/2011 |
| TW | 201140695 A | 11/2011 |
| TW | 201144475 A | 12/2011 |
| TW | 201411776 A | 3/2014 |
| TW | 201430951 A | 8/2014 |
| TW | 201527587 A | 7/2015 |
| TW | 201546896 A | 12/2015 |
| TW | 201621974 A | 6/2016 |
| WO | WO-2004032196 A2 | 4/2004 |
| WO | WO-2006014471 A1 | 2/2006 |
| WO | WO-2006018441 A1 | 2/2006 |
| WO | WO-2006026350 A2 | 3/2006 |
| WO | WO-2006104741 A1 | 10/2006 |
| WO | WO-2007043709 A1 | 4/2007 |
| WO | WO-2007118026 A2 | 10/2007 |
| WO | WO-2011087580 A1 | 7/2011 |
| WO | WO-2011087850 A1 | 7/2011 |
| WO | WO-2011130326 A2 | 10/2011 |
| WO | WO-2011130397 A2 | 10/2011 |
| WO | WO-2012040317 A2 | 3/2012 |
| WO | WO-2012048094 A2 | 4/2012 |
| WO | WO-2012087737 A2 | 6/2012 |
| WO | WO-2013032786 A2 | 3/2013 |
| WO | WO-2013043330 A1 | 3/2013 |
| WO | WO-2013065806 A1 | 5/2013 |
| WO | WO-2013095396 A1 | 6/2013 |
| WO | WO-2013112727 A1 | 8/2013 |
| WO | WO-2013137115 A1 | 9/2013 |
| WO | WO-2013148880 A1 | 10/2013 |
| WO | WO-2018204709 A1 | 11/2018 |
| WO | WO-2020093013 A1 | 5/2020 |
| WO | WO-2020131635 A1 | 6/2020 |

OTHER PUBLICATIONS

Chinese Fifth Office Action dated Jun. 30, 2020 issued in Application No. CN 201510091775.9.

Chinese First Office Action dated Apr. 11, 2016 issued in Application No. CN 201510086588.1.

(56) References Cited

OTHER PUBLICATIONS

Chinese First Office Action dated Feb. 22, 2016 issued in Application No. CN 201380006994.1.
Chinese First Office Action dated Jan. 20, 2020 issued in Application No. CN 201710347032.2.
Chinese First Office Action dated Jul. 10, 2020 issued in Application No. CN 201710839679.7.
Chinese First Office Action dated Jun. 2, 2015 issued in Application No. CN 201180045808.6.
Chinese First Office Action dated Mar. 30, 2018 issued in Application No. CN 201610206201.6.
Chinese First Office Action dated May 19, 2016 issued in Application No. CN 201310021460.8.
Chinese First Office Action dated May 27, 2017 issued in Application No. CN 201510091775.9.
Chinese First Office Action dated Nov. 19, 2015 issued in Application No. CN 201280046487.6.
Chinese First Office Action dated Nov. 28, 2016 issued in Application No. CN 201410521390.7.
Chinese First Office Action dated Nov. 6, 2015 issued in Application No. CN 201280053888.4.
Chinese First Office Action dated Oct. 8, 2018 issued in Application No. CN 201710522311.8.
Chinese Fourt Office Action dated May 16, 2018 issued in Application No. CN 201310021460.8.
Chinese Fourth Office Action dated Jul. 5, 2021 issued in Application No. CN 201710347032.2.
Chinese Fourth Office Action dated Mar. 27, 2019 issued in Application No. CN 201510091775.9.
Chinese Notification of Reexamination dated Apr. 17, 2020 issued in Application No. CN 201310021460.8.
Chinese Reexamination Decision dated Sep. 11, 2020 issued in Application No. CN 201310021460.8.
Chinese Second Office Action dated Apr. 12, 2021 issued in Application No. CN 201710839679.7.
Chinese Second Office Action dated Apr. 13, 2017 issued in Application No. CN 201310021460.8.
Chinese Second Office Action dated Aug. 14, 2020 issued in Application No. CN 201710347032.2.
Chinese Second Office Action dated Aug. 16, 2016 issued in Application No. CN 201280053888.4.
Chinese Second Office Action dated Aug. 22, 2016 issued in Application No. CN 201280046487.6.
Chinese Second Office Action dated Feb. 2, 2016 issued in Application No. CN 201180045808.6.
Chinese Second Office Action dated Feb. 6, 2017 issued in Application No. CN 201380006994.1.
Chinese Second Office Action dated Jan. 24, 2019 issued in Application No. CN 201610206201.6.
Chinese Second Office Action dated Jun. 13, 2019 issued in Application No. CN 201710522311.8.
Chinese Second Office Action dated Mar. 20, 2017 issued in Application No. CN 201510086588.1.
Chinese Second Office Action dated Mar. 26, 2018 issued in Application No. CN 201510091775.9.
Chinese Third Office Action dated Dec. 22, 2017, issued in Application No. CN 201380006994.1.
Chinese Third Office Action dated Jan. 6, 2021 issued in Application No. CN 201710347032.2.
Chinese Third Office Action dated Oct. 15, 2018 issued in Application No. CN 201510091775.9.
Chinese Third Office Action dated Oct. 17, 2017 issued in Application No. CN 201310021460.8.
Chinese Third Office Action dated Sep. 15, 2021 issued in Application No. CN 201710839679.7.
Choi, Gyu-Jin et al., (2009) "Plasma-enhanced atomic layer deposition of TiO2 and Al-doped TiO2 films using N2O and O2 reactants," Journal of the Electrochemical Society, 156(9):G138-G143.
Elam et al., (2003) "Growth of ZnO/Al2O3 Alloy Films Using Atomic Layer Deposition Techniques," Chemistry of Materials, 2003, vol. 15, No. 4, pp. 1020-1028. doi:10.1021/cm020607+.
European Examination Report dated Dec. 11, 2017 issued in Application No. EP 13 15 2046.
European Extended Search Report dated Apr. 14, 2014 issued in Application No. EP13152046.2.
Faraz et al., (2015) "Atomic Layer Etching: What Can We Learn from Atomic Layer Deposition?," ECS Journal of Solid State Science and Technology, 4(6):N5023-N5032.
Hausmann et al., (2002) "Atomic Layer Deposition of Hafnium and Zirconium Oxides Using Metal Amide Precursors," Chem. Mater. 14(10):4350-4358.
International Preliminary Report on Patentability dated Dec. 16, 2021, for International Application No. PCT/US2020/035996.
International Preliminary Report on Patentability dated Mar. 26, 2020 issued in Application No. PCT/US2018/050049.
International Preliminary Report on Patentability dated Nov. 11, 2021, for International Application No. PCT/US2019/040648.
International Search Report and Written Opinion dated Feb. 25, 2019 issued in Application No. PCT/US2018/050049.
International Search Report and Written Opinion dated Jan. 30, 2020 issued in Application No. PCT/US2019/040648.
Japanese Decision of Refusal dated Dec. 5, 2017 issued in Application No. JP2014-554825.
Japanese Decision of Rejection dated Jan. 9, 2018 issued in Application No. JP 2013-007612.
Japanese Decision to Grant dated Sep. 10, 2018 issued in Application No. JP 2013-230782.
Japanese First Office Action dated Aug. 3, 2021 issued in Application No. JP 2017-122828.
Japanese First Office Action dated Dec. 18, 2018 issued in Application No. JP 2014-262248.
Japanese First Office Action dated May 29, 2019 issued in Application No. JP 2018-090402.
Japanese First Office Action dated Oct. 31, 2017 issued in Application No. JP 2013-230782.
Japanese Notice of Reason for Refusal dated Jul. 24, 2018 issued in Application No. JP 2017-159931.
Japanese Notification of Reasons for Rejection dated Jan. 10, 2017 issued in Application No. JP2014-554825.
Japanese Office Action dated Apr. 19, 2016 issued in Application No. JP 2015-21804.
Japanese Office Action dated Aug. 23, 2016 issued in Application No. JP 2014-531838.
Japanese Office Action dated Dec. 5, 2017 issued in Application No. JP 2013-231188.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Jun. 17, 2019 issued in Application No. JP 2017-159931.
Japanese Second Office Action dated May 22, 2018 issued in Application No. JP 2013-230782.
Japanese Second Office Action [Decision of Rejection] dated Dec. 4, 2018 issued in Application No. JP 2013-231188.
Japanese Second Office Action [Decision of Rejection] dated Jan. 14, 2020 issued in Application No. JP 2018-090402.
Japanese Third Office Action dated Mar. 10, 2020 issued in Application No. JP 2017-159931.
Kim, H., et al., (2002) "The Growth of Tantalum Thin Films by Plasma-Enhanced Atomic Layer Deposition and Diffusion Barrier Properties," Mat. Res. Soc. Symp. Proc. 716:B8.5.1-B8.5.6.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Ko, Myoung-Gyun, et al., "Characterization of ruthenium thin film deposited by rf-direct plasma atomic layer deposition," 209th ECS Meeting, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by

(56) References Cited

OTHER PUBLICATIONS

Using RF-Direct Plasma-Enhanced Atomic-Layer Deposition," Journal of the Korean Physical Society, 53(4):2123-2128.
Korean Decision for Grant dated Aug. 19, 2021 issued in Application No. KR 10-2021-0008342.
Korean Decision for Grant of Patent, dated Jul. 25, 2018, issued in Application No. KR 10-2013-7010291.
Korean Decision for Grant of Patent, dated May 17, 2019 issued in Application No. KR 10-2014-7008696.
Korean Decision for Grant of Patent dated Oct. 20, 2020 issued in Application No. KR 10-2013-0126834.
Korean Decision for Grant of Patent dated Sep. 7, 2020 issued in Application No. KR 10-2013-0135907.
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean Final Office Action dated Jun. 29, 2016, issued in Application No. KR 10-2015-0022610.
Korean First Office Action dated Apr. 21, 2021 issued in Application No. KR 10-2014-0131380.
Korean First Office Action dated Apr. 21, 2021, issued in Application No. KR 10-2015-0023868.
Korean First Office Action dated Apr. 7, 2021 issued in Application No. KR 10-2021-0020087.
Korean First Office Action dated Aug. 19, 2019 issued in Application No. KR 10-2019-7012231.
Korean First Office Action dated Aug. 3, 2021 issued in Application No. KR 10-2014-0193925.
Korean First Office Action dated Feb. 19, 2016, issued in Application No. KR 10-2015-0022610.
Korean First Office Action dated Feb. 23, 2021 issued in Application No. KR 10-2021-0008342.
Korean First Office Action dated Jan. 15, 2020 issued in Application No. KR 10-2013-0135907.
Korean First Office Action dated Jun. 28, 2019 issued in Application No. KR 10-2013-0056776.
Korean First Office Action dated May 14, 2020 issued in Application No. KR 10-2013-0135905.
Korean First Office Action dated May 21, 2021 issued in Application No. KR 10-2015-0028413.
Korean First Office Action dated May 27, 2020 issued in Application No. KR 10-2013-0126834.
Korean First Office Action dated Oct. 2, 2018 issued in Application No. KR 10-2014-7010949.
Korean First Office Action dated Oct. 31, 2017 issued in Application No. KR 10-2014-7008696.
Korean Notice of Provisional Rejection dated Dec. 6, 2013 issued in Application No. KR 10-2012-0043797.
Korean Office Action, dated Aug. 23, 2017, issued in Application No. KR 10-2017-7020548.
Korean Office Action, dated Feb. 7, 2017, issued in Application No. KR 10-2012-7004925.
Korean Office Action, dated May 23, 2017, issued in Application No. KR 10-2013-7010291.
Korean Office Action, dated Nov. 27, 2017, issued in Application No. KR 10-2013-7010291.
Korean Second Office Action dated Oct. 22, 2021 issued in Application No. KR 10-2021-0020087.
Korean Second Office Action dated Sep. 20, 2018 issued in Application No. KR 10-2014-7008696.
KR Final Rejection dated Oct. 21, 2021, in application KR10-2021-0020087 with English translation.
KR Office Action dated Dec. 17, 2021, in Application No. KR1020210020087 with English translation.
KR Office Action dated Jan. 14, 2022, in Application No. KR1020140193925 with English translation.
KR Office Action dated Nov. 23, 2021, in Application No. KR1020140131380 with English translation.
KR Office Action dated Oct. 28, 2021, in Application No. KR1020150099945 with English translation.
KR Office Action dated Sep. 16, 2021, in application No. KR1020170077085.
Kwon, J., et al., (Nov. 2011) "Tracking by Sampling Trackers" 2011 International Conference on Computer Vision. IEEE, 2011, pp. 1195-1202.
Lavareda et al., (2004) "Properties of a-Si:H TFTs using silicon carbonitride as dielectric," Journal of Non-Crystalline Solids, 338-340:797-801.
Lee et al., (2005) "Chemically conformal deposition of SrTiO3 thin films by Atomic Layer Deposition using conventional metal organic precursors and remote-plasma activated H2O," School of Materials Science and Engineering, and Inter-university Semiconductor Research Center, Seoul National University, Microelectronic Engineering 80:158-161.
Lee, Jong Ju, (2005) "Low-impurity, highly conformal atomic layer deposition of titanium nitride using NH3—Ar—H2 plasma treatment for capacitor electrodes," Materials Letters, 59:615-617.
Li, Xingcun, et al., (2011) "Atomic Layer Deposition Al2O3 Thin Films in Magnetized Radio Frequency Plasma Source," Physics Procedia 18:100-106.
Man P.F. et al., (Feb. 11-15, 1996) "Elimination of Post-Release Adhesion in Microstructures Using Conformal Fluorocarbon Coatings," MEMS '96 Proceedings, IEEE, pp. 55-60.
Nguyen, S.V. et al., (Jan./Mar. 1999) "Plasma-assist chemical vapor deposition of dielectric thin films for ULSI semiconductor circuits," IBM J.Res.Develop. 43(1.2):5-38.
Notice of Allowance dated Feb. 7, 2020 issued in U.S. Appl. No. 16/034,022.
Notice of Allowance dated Sep. 2, 2021 in U.S. Appl. No. 16/428,067.
PCT International Preliminary Report on Patentability and Written Opinion dated Apr. 3, 2014, issued in Application No. PCT/US2012/052769.
PCT International Preliminary Report on Patentability and Written Opinion dated Apr. 4, 2013 issued in Application No. PCT/US2011/052537.
PCT International Preliminary Report on Patentability and Written Opinion dated Aug. 7, 2014, issued in Application No. PCT/US2013/022977.
PCT International Preliminary Report on Patentability and Written Opinion dated Mar. 13, 2014, issued in Application No. PCT/US2012/051740.
PCT International Preliminary Report on Patentability and Written Opinion, dated Oct. 26, 2012, issued in PCT/US2011/032303.
PCT International Preliminary Report on Patentability, dated Oct. 26, 2012, issued in Application No. PCT/US2011/032186.
PCT International Search Report and Written Opinion dated Dec. 18, 2012, issued in Application No. PCT/US2012/052769..
PCT International Search Report and Written Opinion, dated Feb. 20, 2012, issued in PCT/US2011/032303.
PCT International Search Report and Written Opinion dated Feb. 28, 2013, issued in Application No. PCT/US2012/051740.
PCT International Search Report and Written Opinion dated May 2, 2012 issued in Application No. PCT/US2011/052537.
PCT International Search Report and Written Opinion dated May 27, 2013, issued in Application No. PCT/US2013/022977.
PCT International Search Report and Written Opinion, dated Oct. 20, 2011, issued in Application No. PCT/US2011/032186.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP®80 Range," Oxford Instruments (2010), 8 pages.
Pritchett, Merry, (May 2004) "Adherence/Diffusion Barrier Layers for Copper Metallization: Amorphous Carbon:Silicon Polymerized Films," Dissertation Prepared for the Degree of Doctor of Philosophy, University of Texas, 113pp.

(56) References Cited

OTHER PUBLICATIONS

Profijt, H.B., et al., "Plasma-Assisted Atomic Layer Deposition: Basics, Opportunities, and Challenges," J. Vac. Sci. Technol. A, vol. 29, No. 5 (Sep./Oct. 2011), pp. 1-26.
Puurunen, Riikka L. (2005) "Surface chemistry of atomic layer deposition: A case study for the trimethylaluminum/water process," Journal of Applied Physics, 97:121301-1-121301-52.
Singapore Eligibility to Grant w/Supplemental Examinatinon Report dated Apr. 23, 2019 issued in Application No. SG 10201408801Q.
Singapore Notice of Eligibility and Examination Report dated Nov. 6, 2020 issued in Application No. SG 10201807090Q.
Singapore Search Report and Written Opinion dated Mar. 14, 2019 issued in Application No. SG 10201807090Q.
Singapore Search Report and Written Opinion dated May 19, 2020 issued in Application No. SG 10201607194P.
Singapore Second Written Opinion dated Jan. 24, 2020 issued in Application No. SG 10201807090Q.
Singapore Supplementary Examination Report dated Aug. 11, 2016 issued in Application No. SG 11201404315R.
Singapore Supplementary Examination Report dated Jun. 1, 2016 issued in Application No. SG 11201400633R.
Taiwan Examination Report dated Jan. 11, 2017 issued in Application No. TW 102138326.
Taiwan Examination Report dated Jul. 13, 2017 issued in Application No. TW 102140721.
Taiwan Examination Report dated Mar. 29, 2017 issued in Application No. TW 102102054.
Taiwan First Office Action dated Jun. 26, 2018 issued in Application No. TW 103145386.
Taiwan First Office Action dated Mar. 14, 2018 issued in Application No. TW 106122777.
Taiwan First Office Action dated May 3, 2018 issued in Application No. TW 103133765.
Taiwan First Office Action dated Oct. 16, 2019 issued in Application No. TW 105109955.
Taiwan First Office Action dated Sep. 13, 2018, issued in Application No. TW 104104648.
Taiwan First Office Action dated Sep. 20, 2018 issued in Application No. TW 106140906.
Taiwan Notice of Allowance and Search Report dated Aug. 30, 2018 issued in Application No. TW 104104471.
Taiwan Notice of Allowance and Search Report dated Dec. 18, 2015 issued in Application No. TW 101134692.
Taiwan Notice of Allowance dated Jul. 2, 2020, issued in Application No. TW 108119661.
Taiwan Office Action and Search Report dated Jan. 27, 2016 issued in Application No. TW 101131556.
Taiwan Office Action and Search Report dated Jul. 20, 2016 issued in Application No. TW 102102879.
Taiwan Office Action and Search Report dated Nov. 9, 2016 issued in Application No. TW 101131556.
Taiwan Office Action dated Apr. 27, 2016 issued in Application No. TW 100113041.
Taiwan Office Action dated May 5, 2016 issued in Application No. TW 100134208.
Taiwan Office Action dated Oct. 19, 2017 issued in Application No. TW 105130207.
Taiwan Office Action dated Oct. 25, 2016 issued in Application No. TW 102117772.
Taiwan Rejection Decision dated Aug. 17, 2017 issued in Application No. TW 102117772.
Taiwan Second Office Action dated Dec. 14, 2018 issued in Application No. TW 106122777.
Taiwanese First Office Action dated Dec. 21, 2020 issued in Application No. TW 106121191.
Taiwanese First Office Action dated Nov. 9, 2018 issued in Application No. TW 104122669.
Taiwanese First Office Action dated Sep. 14, 2018 issued in Application No. TW 104106165.
US Examiner's Answer to Appeal Brief (filed May 22, 2014) Before the Patent Trial and Appeal Board dated Aug. 14, 2014 issued U.S. Appl. No. 13/224,240.
US Final Office Action dated Apr. 25, 2013 issued in U.S. Appl. No. 13/084,305.
US Final Office Action dated Aug. 20, 2020 issued in U.S. Appl. No. 16/453,237.
US Final Office Action dated Aug. 24, 2016 issued in U.S. Appl. No. 14/335,785.
US Final Office Action dated Dec. 16, 2015 issued in U.S. Appl. No. 14/187,145.
US Final Office Action dated Dec. 4, 2017 issued in U.S. Appl. No. 15/609,864.
US Final Office Action dated Feb. 26, 2013 issued in U.S. Appl. No. 13/011,569.
US Final Office Action dated Jan. 15, 2015 issued in U.S. Appl. No. 14/144,107.
US Final Office Action dated Jan. 21, 2020 issued in U.S. Appl. No. 15/847,744.
US Final Office Action dated Jun. 10, 2015 issued in U.S. Appl. No. 14/231,554.
US Final Office Action dated Jun. 28, 2017 issued in U.S. Appl. No. 13/963,212.
US Final Office Action dated Mar. 18, 2016 issued U.S. Appl. No. 14/607,997.
US Final Office Action dated Nov. 1, 2016 issued in U.S. Appl. No. 14/194,549.
US Final Office Action dated Nov. 16, 2018 issued in U.S. Appl. No. 15/683,397.
US Final Office Action dated Nov. 22, 2013 issued U.S. Appl. No. 13/224,240.
US Final Office Action dated Nov. 24, 2014 issued in U.S. Appl. No. 13/953,616.
US Final Office Action dated Sep. 13, 2013 issued in U.S. Appl. No. 13/084,399.
US Final Office Action dated Sep. 20, 2017 issued in U.S. Appl. No. 14/194,549.
US Final Office Action dated Sep. 25, 2020 issued in U.S. Appl. No. 16/556,122.
US Final Office Action dated Sep. 27, 2019 issued in U.S. Appl. No. 16/034,022.
US Notice of Allowance [Corrected Notice of Allowability] dated Apr. 19, 2017 issued in U.S. Appl. No. 14/335,785.
US Notice of Allowance [Corrected Notice of Allowability] dated Nov. 28, 2017 issued in U.S. Appl. No. 15/224,347.
US Notice of Allowance dated Apr. 18, 2017 issued in U.S. Appl. No. 15/178,474.
US Notice of Allowance dated Apr. 9, 2018 issued in U.S. Appl. No. 15/201,221.
US Notice of Allowance dated Aug. 22, 2017 issued in U.S. Appl. No. 14/987,542.
US Notice of Allowance dated Aug. 31, 2015 issued in U.S. Appl. No. 14/231,554.
US Notice of Allowance dated Aug. 5, 2015 issued in U.S. Appl. No. 14/183,287.
US Notice of Allowance dated Aug. 7, 2014 issued U.S. Appl. No. 14/133,239.
US Notice of Allowance dated Dec. 5, 2018 issued in U.S. Appl. No. 15/703,917.
US Notice of Allowance dated Feb. 10, 2017 issued in U.S. Appl. No. 15/178,474.
US Notice of Allowance dated Feb. 11, 2016 issued in U.S. Appl. No. 14/061,587.
US Notice of Allowance dated Feb. 12, 2016 issued in U.S. Appl. No. 14/074,596.
US Notice of Allowance dated Feb. 14, 2018 issued in U.S. Appl. No. 14/194,549.
US Notice of Allowance dated Feb. 22, 2017 issued in U.S. Appl. No. 14/335,785.
US Notice of Allowance dated Feb. 25, 2016 issued in U.S. Appl. No. 14/187,145.
US Notice of Allowance dated Jan. 15, 2014 issued in U.S. Appl. No. 13/084,399.

(56) References Cited

OTHER PUBLICATIONS

US Notice of Allowance dated Jan. 29, 2018 issued in U.S. Appl. No. 15/650,662.
US Notice of Allowance dated Jul. 15, 2016 issued in U.S. Appl. No. 14/678,736.
US Notice of Allowance dated Jul. 26, 2013, issued U.S. Appl. No. 13/414,619.
US Notice of Allowance dated Jun. 15, 2017 issued in U.S. Appl. No. 15/015,952.
US Notice of Allowance dated Jun. 16, 2016 issued U.S. Appl. No. 14/607,997.
US Notice of Allowance dated Jun. 19, 2013 issued U.S. Appl. No. 13/242,084.
US Notice of Allowance dated Jun. 20, 2017 issued in U.S. Appl. No. 14/987,542.
US Notice of Allowance dated Jun. 27, 2017 issued in U.S. Appl. No. 15/199,608.
US Notice of Allowance dated Mar. 19, 2015 issued in U.S. Appl. No. 14/144,107.
US Notice of Allowance dated Mar. 21, 2017 issued in U.S. Appl. No. 14/335,785.
US Notice of Allowance dated Mar. 24, 2021 issued in U.S. Appl. No. 16/428,067.
US Notice of Allowance dated Mar. 26, 2018 issued in U.S. Appl. No. 15/253,301.
US Notice of Allowance dated Mar. 27, 2017 issued in U.S. Appl. No. 15/178,474.
US Notice of Allowance dated Mar. 28, 2018 issued in U.S. Appl. No. 15/426,889.
US Notice of Allowance dated Mar. 28, 2019 issued in U.S. Appl. No. 15/683,397.
US Notice of Allowance dated Mar. 30, 2020 issued in U.S. Appl. No. 15/965,628.
US Notice of Allowance dated Mar. 7, 2019 issued in U.S. Appl. No. 15/654,186.
US Notice of Allowance dated Mar. 9, 2018 issued in U.S. Appl. No. 15/609,864.
US Notice of Allowance dated May 28, 2020 issued in U.S. Appl. No. 15/847,744.
US Notice of Allowance dated May 6, 2013 issued in U.S. Appl. No. 13/011,569.
US Notice of Allowance dated Nov. 17, 2016 issued U.S. Appl. No. 13/224,240.
US Notice of Allowance dated Nov. 19, 2014 issued in U.S. Appl. No. 13/607,386.
US Notice of Allowance dated Nov. 20, 2015 issued in U.S. Appl. No. 14/074,617.
US Notice of Allowance dated Nov. 26, 2014 issued U.S. Appl. No. 14/133,239.
US Notice of Allowance dated Nov. 4, 2016 issued in U.S. Appl. No. 14/335,785.
US Notice of Allowance dated Nov. 4, 2020 issued in U.S. Appl. No. 16/453,237.
US Notice of Allowance dated Oct. 1, 2015 issued in U.S. Appl. No. 14/137,860.
US Notice of Allowance dated Oct. 13, 2016 issued in U.S. Appl. No. 15/019,904.
US Notice of Allowance dated Oct. 3, 2019 issued in U.S. Appl. No. 15/976,793.
US Notice of Allowance dated Oct. 4, 2013 issued U.S. Appl. No. 13/472,282.
US Notice of Allowance dated Oct. 4, 2017 issued in U.S. Appl. No. 15/224,347.
US Notice of Allowance dated Oct. 8, 2014 issued in U.S. Appl. No. 13/607,386.
US Notice of Allowance dated Sep. 19, 2013 issued U.S. Appl. No. 13/242,084.
US Notice of Allowance dated Sep. 26, 2016 issued in U.S. Appl. No. 14/552,011.
US Notice of Allowance dated Sep. 27, 2016 issued U.S. Appl. No. 14/607,997.
US Notice of Allowance dated Sep. 28, 2017 issued in U.S. Appl. No. 15/399,637.
US Notice of Allowance dated Sep. 30, 2011 issued in U.S. Appl. No. 12/889,132.
US Notice of Allowance (Supplemental Notice of Allowability) dated Feb. 21, 2017 issued U.S. Appl. No. 13/224,240.
US Notice of Allowance [Supplemental Notice of Allowability] dated Mar. 1, 2016 issued in U.S. Appl. No. 14/061,587.
US Notice of Allowance [Supplemental Notice of Allowability] dated Oct. 22, 2015 issued in U.S. Appl. No. 14/137,860.
US Office Action dated Apr. 1, 2020 issued in U.S. Appl. No. 16/556,122.
US Office Action dated Apr. 13, 2015 issued in U.S. Appl. No. 14/335,785.
US Office Action dated Apr. 19, 2017 issued in U.S. Appl. No. 14/194,549.
US Office Action dated Apr. 29, 2013 issued U.S. Appl. No. 13/224,240.
US Office Action dated Apr. 4, 2013 issued U.S. Appl. No. 13/242,084.
US Office Action dated Apr. 13, 2011 issued in U.S. Appl. No. 12/889,132.
US Office Action dated Aug. 1, 2012 issued in U.S. Appl. No. 13/011,569.
US Office Action dated Aug. 1, 2016 issued in U.S. Appl. No. 14/932,869.
US Office Action dated Aug. 14, 2015 issued in U.S. Appl. No. 14/061,587.
US Office Action dated Aug. 18, 2017 issued in U.S. Appl. No. 15/201,221.
US Office Action dated Aug. 22, 2017 issued in U.S. Appl. No. 15/609,864.
US Office Action dated Dec. 11, 2014 issued in U.S. Appl. No. 14/074,596.
US Office Action dated Dec. 24, 2015 issued in U.S. Appl. No. 14/074,596.
US Office Action dated Dec. 30, 2016 issued in U.S. Appl. No. 15/015,952.
US Office Action dated Dec. 7, 2020 issued in U.S. Appl. No. 16/428,067.
US Office Action dated Feb. 14, 2020 issued in U.S. Appl. No. 16/453,237.
US Office Action dated Feb. 3, 2017 issued in U.S. Appl. No. 14/987,542.
US Office Action dated Jan. 12, 2017 issued in U.S. Appl. No. 13/963,212.
US Office Action dated Jan. 2, 2015 issued in U.S. Appl. No. 14/231,554.
US Office Action dated Jan. 24, 2018 issued in U.S. Appl. No. 13/963,212.
US Office Action dated Jan. 26, 2018 issued in U.S. Appl. No. 15/683,397.
US Office Action dated Jul. 1, 2016 issued in U.S. Appl. No. 13/963,212.
US Office Action dated Jul. 10, 2014 issued in U.S. Appl. No. 14/144,107.
US Office Action dated Jul. 18, 2018 issued in U.S. Appl. No. 15/703,917.
US Office Action dated Jul. 2, 2015 issued in U.S. Appl. No. 14/187,145.
US Office Action dated Jul. 30, 2019 issued in U.S. Appl. No. 15/847,744.
US Office Action dated Jun. 13, 2014 issued in U.S. Appl. No. 13/953,616.
US Office Action dated Jun. 14, 2016 issued in U.S. Appl. No. 15/019,904.
US Office Action dated Jun. 7, 2013 issued U.S. Appl. No. 13/414,619.
US Office Action dated Jun. 9, 2017 issued in U.S. Appl. No. 15/224,347.
US Office Action dated Mar. 15, 2013 issued in U.S. Appl. No. 13/084,399.

(56) References Cited

OTHER PUBLICATIONS

US Office Action dated Mar. 2, 2015 issued in U.S. Appl. No. 14/137,860.
US Office Action dated Mar. 21, 2019 issued in U.S. Appl. No. 15/976,793.
US Office Action dated Mar. 21, 2019 issued in U.S. Appl. No. 16/034,022.
US Office Action dated May 15, 2015 issued in U.S. Appl. No. 14/074,617.
US Office Action dated May 21, 2014 issued in U.S. Appl. No. 13/607,386.
US Office Action dated May 24, 2013 issued U.S. Appl. No. 13/472,282.
US Office Action dated May 25, 2016 issued in U.S. Appl. No. 14/552,011.
US Office Action dated Nov. 25, 2016 issued in U.S. Appl. No. 15/178,474.
US Office Action dated Nov. 9, 2018 issued in U.S. Appl. No. 15/654,186.
US Office Action dated Oct. 1, 2019 issued in U.S. Appl. No. 15/965,628.
US Office Action dated Oct. 21, 2015 issued in U.S. Appl. No. 14/194,549.
US Office Action dated Oct. 6, 2017 issued in U.S. Appl. No. 15/253,301.
US Office Action dated Sep. 14, 2012 issued in U.S. Appl. No. 13/084,305.
US Office Action dated Sep. 21, 2015 issued U.S. Appl. No. 14/607,997.
US Office Action dated Sep. 26, 2017 issued in U.S. Appl. No. 15/426,889.
U.S. Appl. No. 16/036,784, inventors Ou et al., filed Jul. 16, 2018.
U.S. Appl. No. 17/465,555, Inventors Kang et al., filed Sep. 2, 2021.
U.S. Appl. No. 17/594,816, Inventors Soe et al., filed Oct. 29, 2021.
US Patent Board Decision on Appeal Before the Patent Trial and Appeal Board (Examiner Affirmed) dated Aug. 11, 2016 issued U.S. Appl. No. 13/224,240.
van der Straten et al., (2004) "Atomic layer deposition of tantalum nitride for ultrathin liner applications in advanced copper metallization schemes," Journal of Materials Research, 19(2):447-453.
CN Office Action dated May 31, 2022 in Application No. CN202010046740.4 with English translation.
CN Office Action dated Feb. 26, 2024 in CN Application No. 202080055513.6, with English Translation.
CN Office Action dated Mar. 30, 2023, in Application No. CN201880073124.9 with English translation.
CN Office Action dated May 22, 2024 in CN Application No. 202011057147.6 with English translation.
CN Office Action dated Oct. 18, 2024 in CN Application No. 201980098159.2 with English translation.
CN Office Action dated Sep. 21, 2023, in Application No. CN201880073124.9 with English translation.
International Preliminary Report on Patentability and Written Opinion dated Jun. 13, 2024 in PCT Application No. PCT/US2022/080683.
International Search Report and Written Opinion dated Apr. 14, 2023 in PCT Application No. PCT/US2022/080683.
JP Office Action dated Aug. 29, 2023 in Application No. JP2021-185396 with EnglishTranslation.
JP Office Action dated Feb. 7, 2023, in Application No. JP2021-185396 with English translation.
JP Office Action dated Jun. 27, 2023 in Application No. JP2021-564415 with English translation.
JP Office Action dated Oct. 10, 2023 in Application No. JP2021-564415 with EnglishTranslation.
JP Office Action dated Oct. 18, 2022, in Application No. JP2020-514992 with English translation.
KR Notice of Allowances dated Aug. 1, 2024 in KR Application No. 10-2021-7039337 with English translation.
KR Notice of Allowances dated Oct. 17, 2024 in KR Application No. 10-2023-0184996 with English Translation.
KR Office Action dated Dec. 23, 2022 in Application No. KR10-2022-0068027 With English Translation.
KR Office Action dated Feb. 15, 2022, in Application No. KR10-2017-0077085 with English Translation.
KR Office action dated Aug. 8, 2022 in KR Application No. KR10-2015-0162556 with English translation.
KR Office Action dated Aug. 17, 2023, in application No. KR10-2016-0039946 with English translation.
KR Office Action dated Aug. 30, 2023, in Application No. KR10-2020-7010492 with English Translation.
KR Office Action dated Feb. 5, 2024 in KR Application No. 10-2023-0184996, with EnglishTranslation.
KR Office Action dated Feb. 7, 2022, in Application No. KR1020150023868 with English translation.
KR Office action dated Feb. 24, 2023 in KR Application No. KR10-2015-0162556 with English translation.
KR Office Action dated Jan. 5, 2023 in Application No. KR10-2016-0039946 with English translation.
KR Office Action dated Jan. 18, 2023 in Application No. KR10-2022-0059033 with English translation.
KR Office Action dated Jul. 21, 2023, in Application No. KR10-2022-0068027 with English translation.
KR Office Action dated Jun. 8, 2022, in Application No. KR10-2015-0099945 with English translation.
KR Office Action dated May 3, 2023, in Application No. KR10-2022-0114140 with English Translation.
KR Office Action dated May 20, 2022, in Application No. KR10-2022-0023506 with English translation.
KR Office Action dated Nov. 26, 2023 in KR Application No. 10-2021-7039337, with English Translation.
KR Office Action dated Nov. 28, 2024 in KR Application No. 10-2022-7000598, with English Translation.
KR Office Action dated Oct. 19, 2022, 2022, in Application No. KR10-2022-0023506 with English translation.
KR Office Action dated Sep. 5, 2023, in Application No. KR10-2023-0008206 with English Translation.
KR Office Action dated Sep. 27, 2024 in KR Application No. 10-2020-7010492 with English Translation.
SG Search report and Written Opinion dated Aug. 15, 2023 in Application No. SG11202111962Q.
SG Search report and Written Opinion dated Jul. 14, 2023 in Application No. SG11202113475T.
TW Office Action dated Aug. 31, 2022 In Application No. TW110129265 With English translation.
TW Office Action dated Jun. 17, 2022 in Application No. TW107131673 With English Translation.
TW Office Action dated Aug. 24, 2023, in application No. TW108123910 with English Translation.
TW Office Action dated Jan. 30, 2023 in Application No. TW108123910 with English translation.
U.S Advisory Action dated Dec. 4, 2013 in U.S. Appl. No. 13/084,399.
U.S. Non-Final Office Action dated Aug. 17, 2023, in U.S. Appl. No. 17/594,816.
U.S. Non-Final Office Action dated Jun. 4, 2024 in U.S. Appl. No. 17/465,555.
U.S. Notice of Allowance dated Mar. 13, 2024 in U.S. Appl. No. 17/594,816.
U.S. Notice of Allowance dated Nov. 13, 2024 in U.S. Appl. No. 17/465,555.
U.S. Appl. No. 18/709,780, inventors Gupta A., et al., filed May 13, 2024.
U.S. Restriction Requirement dated Aug. 7, 2020 in U.S. Appl. No. 16/428,067.
U.S. Restriction Requirement dated Oct. 21, 2016 in U.S. Appl. No. 14/987,542.
U.S. Restriction requirement dated Jun. 8, 2023 in U.S. Appl. No. 17/594,816.
U.S. Supplementary Notice of Allowance dated Apr. 17, 2019 in U.S. Appl. No. 15/654,186.

\* cited by examiner

IN-SITU CONTROL OF FILM PROPERTIES DURING ATOMIC LAYER DEPOSITION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Many semiconductor device fabrication processes involve formation of films including silicon-containing films such as silicon nitride and silicon oxide. Some deposition of silicon-containing films involves plasma enhanced chemical vapor deposition (PECVD) and/or atomic layer deposition (ALD) but in some cases it may be difficult to achieve high quality films.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatuses for processing substrates. One aspect involves a method for processing substrates, the method including: providing a semiconductor substrate to a reaction chamber; performing cycles of atomic layer deposition to deposit a film, each cycle including: introducing a first reactant in vapor phase into the reaction chamber to adsorb the first reactant onto a surface of the semiconductor substrate; introducing a dose of a second reactant in vapor phase into the reaction chamber for a dose time; and generating a first plasma in the reaction chamber while the second reactant in vapor phase is in the reaction chamber; and after every n cycles of the atomic layer deposition, exposing the film to a second plasma generated from flowing argon and a second gas, where either (1) the second gas is selected from the group consisting of hydrogen, oxygen, and combinations thereof and a ratio of flow rate of argon to the second gas is between about 50:1 and about 1:1, or (2) the second gas is nitrous oxide and a ratio of flow rate of argon to the second gas is between about 10:1 and about 20:1.

In some embodiments, the method also includes flowing one or more additional gases during the exposing of the film to the second plasma, the one or more additional gases being any one or more of oxygen, nitrous oxide, and helium.

Another aspect involves a method for processing substrates, the method including: providing a semiconductor substrate to a reaction chamber; performing cycles of atomic layer deposition to deposit a film, each cycle including: introducing a first reactant in vapor phase into the reaction chamber to adsorb the first reactant onto a surface of the semiconductor substrate, introducing a dose of a second reactant in vapor phase into the reaction chamber for a dose time, and generating a first plasma in the reaction chamber while the second reactant in vapor phase is in the reaction chamber; and after every n cycles of the atomic layer deposition, exposing the film to a second plasma generated from flowing argon and a second gas having an argon to second gas flow rate ratio of between about 50:1 and about 1:1 to achieve a wet etch rate of less than about 40 Å/min in 100:1 HF.

In various embodiments, the second gas is one or more of hydrogen and oxygen and combinations thereof. The method may also include flowing a third gas during the exposing of the film to the second plasma, where the third gas is one or more of nitrous oxide, helium, and combinations thereof. In some embodiments, a ratio of flow rate of argon to flow rate of the third gas is between about 10:1 and about 20:1.

In some embodiments, the second plasma is generated at a power between about 750 W and about 1625 W per substrate. In some embodiments, the method also includes exposing the deposited film to the second plasma further comprises introducing a mixture of argon and oxygen gas having a flow rate ratio of argon to oxygen gas is about 12:1.

Another aspect involves a method for processing substrates, the method including: providing a semiconductor substrate to a reaction chamber; performing cycles of atomic layer deposition to deposit a film, each cycle including: introducing a first reactant in vapor phase into the reaction chamber to adsorb the first reactant onto a surface of the semiconductor substrate; introducing a dose of a second reactant in vapor phase into the reaction chamber for a dose time; and generating a first plasma in the reaction chamber while the second reactant in vapor phase is in the reaction chamber; and after every n cycles of the atomic layer deposition, exposing the film to a second plasma generated using a power between about 1000 W and about 2000 W at a chamber pressure between about 1 Torr and about 10 Torr to reduce stress of the film to less than about −290 MPa to 55 MPa.

Another aspect involves a method for processing substrates, the method including: providing a semiconductor substrate to a reaction chamber; performing n cycles of atomic layer deposition to deposit a film, each cycle including: introducing a first reactant in vapor phase into the reaction chamber to adsorb the first reactant onto a surface of the semiconductor substrate; introducing a dose of a second reactant in vapor phase into the reaction chamber for a dose time; and generating a first plasma in the reaction chamber while the second reactant in vapor phase is in the reaction chamber; and after every n cycles of the atomic layer deposition, exposing the deposited film to a second plasma using a power between about 3000 W and about 6500 W at a chamber pressure between about 1 Torr and about 5 Torr to reduce electrical leakage to less than about 1E-9 A/cm$^2$ at 2 MV field.

Another aspect involves a method for processing substrates, the method including: providing a semiconductor substrate to a reaction chamber; performing n cycles of atomic layer deposition to deposit a film, each cycle including: introducing a first reactant in vapor phase into the reaction chamber to adsorb the first reactant onto a surface of the semiconductor substrate; introducing a dose of a second reactant in vapor phase into the reaction chamber for a dose time; and generating a first plasma in the reaction chamber while the second reactant in vapor phase is in the reaction chamber; and after every n cycles of the atomic layer deposition, exposing the deposited film to a second plasma using a power between about 3000 W and about 6500 W at a chamber pressure between about 1 Torr and about 5 Torr to yield a treated film, where the treated film has a breakdown voltage greater than 10 MW/cm.

Another aspect involves method for processing substrates, the method including: providing a semiconductor substrate to a reaction chamber; performing n cycles of atomic layer deposition to deposit a silicon-containing film, each cycle including: introducing a first reactant in vapor phase into the reaction chamber to adsorb the first reactant onto a surface of the semiconductor substrate; introducing a dose of a second reactant in vapor phase into the reaction chamber for a dose time; and generating a first plasma in the reaction chamber while the second reactant in vapor phase is in the reaction chamber; after every n cycles of the atomic layer deposition, exposing the deposited silicon-containing film to a second plasma; and introducing fluorine-containing reactive species to form a fluorine-terminated silicon surface.

Another aspect involves a method for processing substrates, the method including: providing a semiconductor substrate to a reaction chamber; performing n cycles of atomic layer deposition to deposit a film, each cycle including: introducing a first reactant in vapor phase into the reaction chamber under conditions allowing the first reactant to adsorb onto a surface of the semiconductor substrate; introducing a dose of a second reactant in vapor phase into the reaction chamber for a dose time; and generating a plasma in the reaction chamber while the second reactant in vapor phase is in the reaction chamber; and during the nth cycle of atomic layer deposition, introducing the dose of the second reactant for an extended dose time of at least 1.5 times longer than the dose time used for the first through (n−1)th cycles of atomic layer deposition.

For any of the above aspects, the film deposited may be silicon oxide. In some embodiments, the film deposited is silicon oxynitride. In some embodiments, the film deposited is boron-doped silicon oxide. In some embodiments, the film deposited is doped silicon oxide to form an n-type semiconductor. In some embodiments, the film deposited is doped silicon oxide to form an p-type semiconductor.

For any of the above aspects, the first reactant may be a silicon-containing precursor.

For any of the above aspects, the second reactant may include one or more oxygen-containing gases. The oxygen-containing gas may be any of oxygen, nitrous oxide, water, carbon dioxide, and combinations thereof.

For any of the above aspects, n may be an integer between and including 5 and 10. For any of the above aspects, the second plasma may be generated by igniting an inert gas. For any of the above aspects, the exposing of the film to the second plasma and the performing of the cycles of the atomic layer deposition may be performed in the same chamber. For any of the above aspects, the exposing of the film to the second plasma and the performing of the cycles of the atomic layer deposition may be performed without breaking vacuum. For any of the above aspects, the exposing of the film to the second plasma may include pulsing the second plasma.

For any of the above aspects, the second plasma may be generated using a plasma density between about 0.4421 W/cm$^2$ and about 1.7684 W/cm$^2$.

Another aspect involves an apparatus for processing substrates, the apparatus including: one or more process chambers, each process chamber including a chuck; one or more gas inlets into the process chambers and associated flow-control hardware; and a controller having at least one processor and a memory, where the at least one processor and the memory are communicatively connected with one another, the at least one processor is at least operatively connected with the flow-control hardware, and the memory stores computer-executable instructions for controlling the at least one processor to at least control the flow-control hardware to: cause introduction of a first reactant in vapor phase to the one or more process chambers from the one or more gas inlets; cause introduction of a second reactant in vapor phase to the one or more chambers from the one or more gas inlets; cause stopping of the introduction of the first reactant; cause stopping of the introduction of the second reactant; and after causing stopping of the introduction of the first reactant and stopping of the introduction of the second reactant, cause generation of a plasma using a combination of an inert gas and an additional gas at a flow rate ratio between the inert gas and the additional gas of between about 50:1 and about 1:1. In some embodiments, where the controller includes instructions to cause introduction of the inert gas and the additional gas after causing stopping of the introduction of the first reactant and stopping of the introduction of the second reactant, without breaking vacuum from causing introduction of the first reactant in vapor phase to the one or more process chambers from the one or more gas inlets and causing introduction of the second reactant in vapor phase to the one or more process chambers from the one or more gas inlets.

Another aspect involves an apparatus for processing substrates, the apparatus including: one or more process chambers, each process chamber including a chuck; one or more gas inlets into the process chambers and associated flow-control hardware; and a controller having at least one processor and a memory, where the at least one processor and the memory are communicatively connected with one another, the at least one processor is at least operatively connected with the flow-control hardware, and the memory stores computer-executable instructions for controlling the at least one processor to at least control the flow-control hardware to: cause introduction of a first reactant in vapor phase to the one or more process chambers from the one or more gas inlets; cause introduction of a second reactant in vapor phase to the one or more chambers from the one or more gas inlets; cause stopping of the introduction of the first reactant; cause stopping of the introduction of the second reactant; and after causing stopping of the introduction of the first reactant and stopping of the introduction of the second reactant, cause generation of a plasma using a combination of an inert gas and an additional gas at a flow rate ratio between the inert gas and the additional gas of between about 10:1 and about 20:1. In some embodiments, where the controller includes instructions to cause introduction of the inert gas and the additional gas after causing stopping of the introduction of the first reactant and stopping of the introduction of the second reactant, without breaking vacuum from causing introduction of the first reactant in vapor phase to the one or more process chambers from the one or more gas inlets and causing introduction of the second reactant in vapor phase to the one or more process chambers from the one or more gas inlets.

For any of the above aspects, the apparatus may include four process chambers and the controller may include instructions for generation of the plasma using a plasma power between about 3000 W and about 6500 W.

These and other aspects are described further below with reference to the drawings.

DETAILED DESCRIPTION

Figure 1:
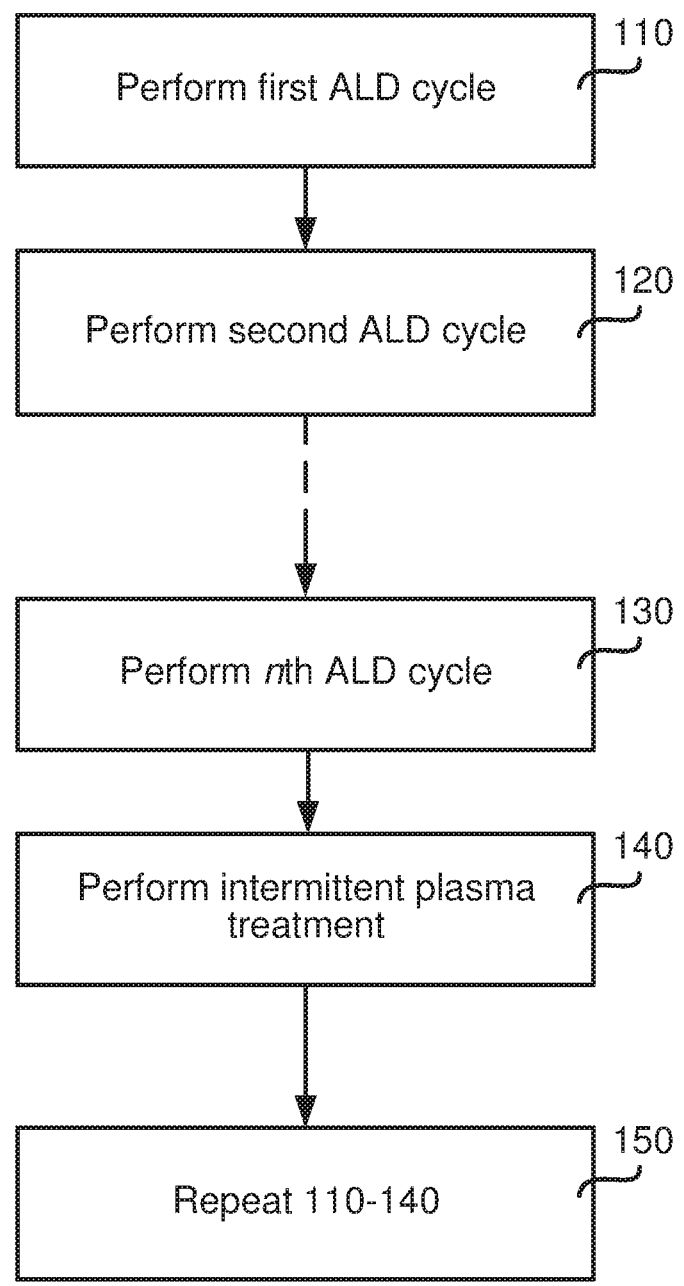
FIGS. 1 and 2 are process flow diagrams depicting operations for methods performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor manufacturing processes often involve fabrication of silicon-containing films, such as silicon oxide, silicon nitride, and silicon carbide. Such films are sometimes deposited onto patterned substrates to form conformal films for various applications, such as barrier layers for contacts. Silicon nitride and silicon carbide layers may be used as encapsulation films, spacers, and barrier films in advanced devices for logic and memory structures, such as FinFETs, MRAM, 3DXPoint, ReRAM, and PCRAM. As devices shrink and technologies become more advanced, higher quality, denser, and more conformal films are desired. Conventional techniques for depositing conformal films involve atomic layer deposition (ALD) but efforts to modify resultant properties of films deposited with this process scheme generally leads to a trade-off with wafer throughput, particularly if qualities such as low wet etch rate or higher breakdown field are desired. Some schemes involve the use of secondary chemistries to affect anisotropic depositions in structures but the process does not regulate or control the resultant contamination in the film.

Provided herein are methods of performing intermittent plasma treatments during ALD of thin films to control the desired physical properties of resultant films. In various embodiments, the film deposited is silicon oxide. Thin silicon oxide films have a thickness of less than about 3 kÅ. The plasma used in such operations can be generated using the same chemistry and process conditions as the plasma used in the activation operation of deposition of silicon oxide by ALD or can involve additional chemistries, frequencies, and/or power levels to achieve desired film properties, the details of which are provided herein as examples. Physical properties that can be modified using this process can include but are not limited to film wet etch rate, breakdown field, film dielectric, atomic composition, and density. Depending on the chemistries used during the intermittent plasma treatment, improvement to sidewall wet etch rate can also be achieved by more active bombardment of incident ions onto surfaces normal to the wafer plane. Intermittent plasma treatment can also be used to affect film conformality on patterned structures via sputtering action at the top of the structure. For deposition processes involving inhibition operations as part of the ALD cycle or after ALD of thin films, intermittent plasma exposure can help modulate certain film properties to achieve high quality films and reduce contamination build-up.

Intermittent plasma treatment can occur after any number of ALD cycles. In some example, plasma treatment is performed every n cycles, where n is between and including 1 and 200, such as n=5, n=10, n=15, or n=20. Plasma composition, power, and treatment time depends on desired film properties and can be tuned to provide particular physical properties, the optimum critical ranges provided herein.

As described above, embodiments described herein involve deposition by ALD. ALD is a technique that deposits thin layers of material using sequential self-limiting reactions. Typically, an ALD cycle includes operations to deliver and adsorb at least one reactant to the substrate surface, and then react the adsorbed reactant with one or more reactants to form at least a partial layer of film. As an example, a silicon oxide deposition cycle may include the following operations: (i) delivery/adsorption of a silicon precursor, (ii) purging of the silicon precursor from the chamber, (iii) delivery of an oxygen-containing reactant with an optional plasma, and (iv) purging of the oxygen-containing reactant and/or plasma from the chamber. When a plasma is used during delivery of the second reactant, in some embodiments, this is referred to as plasma-enhanced atomic layer deposition (PEALD). Delivery or adsorption of the silicon precursor may be referred to as a "dose" operation and delivery of the second reactant to react with the adsorbed precursor may be referred to as a "conversion" operation.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon precursor may include the silicon precursor as well as derivatives of the silicon precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as an oxygen-containing reactant, is introduced to the chamber so that some of these molecules react with the first precursor adsorbed on the surface. In some processes, the second precursor reacts immediately with the adsorbed first precursor. In other embodiments, the second reactant reacts only after a source of activation is applied temporally. In some embodiments, a plasma is ignited during the second reactant dose. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

FIG. 1 shows a process flow diagram depicting operations that are performed in accordance with certain disclosed embodiments.

In operation 110, a first ALD cycle is performed. An ALD cycle involves alternating between doses of two or more reactants with a purge step in between to remove excess reactant/by-products. An example is described below with respect to operations 211-214 of FIG. 2. In some embodiments, the ALD cycle is a PEALD cycle. In operation 120, a second ALD cycle is performed. The second ALD cycle may be performed such that the cycle is identical to the first ALD cycle used in operation 110. ALD may be performed using plasma having a plasma power between about 150 W and about 6000 W. In some embodiments, plasma power in operation 110 is different from plasma power used in operation 140. In some embodiments, plasma power in operation 110 is the same as the plasma power used in operation 140.

In operation 130, the nth ALD cycle may be performed after potentially numerous intervening cycles. That is, any n cycles, or any two or more ALD cycles may be performed in accordance with disclosed embodiments. In various embodiments, each of 1st, 2nd . . . nth ALD cycles may be distinct from one another. In some embodiments, each of the 1st, 2nd, and nth ALD cycles are identical with identical dose, purge, and conversion chemistries and process conditions. In disclosed embodiments, n may be any integer greater than or equal to 2.

In operation 140, an intermittent plasma treatment is performed. The intermittent plasma treatment involves exposure to one or more treatment gases provided using particular gas mixture chemistries and process conditions to achieve a particular film property. The one or more treatment gases include argon. The one or more treatment gases can also include one or more of the following gases: hydrogen, oxygen, nitrous oxide, and helium. In one non-limiting example, gases used to generate the plasma for intermittent plasma treatment includes argon and hydrogen. In one non-limiting example, gases used to generate the plasma for intermittent plasma treatment includes argon, hydrogen, and oxygen. In one non-limiting example, gases used to generate the plasma for intermittent plasma treatment includes argon, hydrogen, oxygen, nitrous oxide, and helium. In one non-limiting example, gases used to generate the plasma for intermittent plasma treatment includes argon, oxygen, nitrous oxide, and helium. In one non-limiting example, gases used to generate the plasma for intermittent plasma treatment includes argon, nitrous oxide, and helium.

In some embodiments, the ratio of flow rate of argon to flow rate of hydrogen is between about 50:1 and about 1:1. In some embodiments, the ratio of flow rate of argon to flow rate of oxygen is between about 50:1 and about 1:1. In some embodiments, the ratio of flow rate of argon to flow rate of nitrous oxide is between about 10:1 and about 20:1. In some embodiments, the ratio of flow rate of argon to flow rate of helium is between about 10:1 and about 20:1.

In general, the number of ALD cycles performed per intermittent plasma treatment and the conditions used during intermittent plasma treatment affects the film properties in such way that certain properties can be tailored depending on the application of the film being deposited.

In some embodiments, the intermittent plasma is pulsed. Pulsing of the intermittent plasma may be performed at a particular duty cycle (duration plasma is on during a period). It will be understood that plasma pulsing may involve repetitions of periods, each of which may last a duration T. The duration T includes the duration for pulse ON time (the duration for which the plasma is in an ON state) and the duration for plasma OFF time (the duration from which the plasma is in an OFF state) during a given period. The pulse frequency will be understood as 1/T. For example, for a plasma pulsing period T=100 µs, frequency is 1/T=1/100µs, or 10 kHz. The duty cycle or duty ratio is the fraction or percentage in a period T during which the plasma is in the ON state such that duty cycle or duty ratio is pulse ON time divided by T. For example, for a plasma pulsing period T=100 µs, if a pulse ON time is 70 µs (such that the duration for which the plasma is in an ON state in a period is 70 µs) and a pulse OFF time is 30 µs (such that the duration for which the plasma is in an OFF state in a period is 30 µs), the duty cycle is 70%.

In some embodiments, the intermittent plasma is pulsed between an ON state and an OFF state, where the voltage applied during the OFF state is 0W. In various embodiments, for example, a pulsed intermittent plasma is pulsed between an OFF state of 0W and an ON state of 1250 W over a particular duration, such as 10 seconds.

Chamber pressure during operation 140 may be used to modulate stress, form a compressive or tensile film, or reduce contaminates. For example, a lower pressure (such as less than about 6 Torr) can be used to form a compressive film, form a film having reduced wet etch rate, eliminate contaminates, or all of the above. A high pressure (such as greater than about 6 Torr) can be used to form a tensile film, form a film having higher wet etch rate, eliminate contaminates, or all of the above. Operation 140 may be performed at a chamber pressure between about 2 Torr and about 10 Torr.

Chamber pressure during operation 140 may be different from that of operation 110. For example, chamber pressure during operation 140 may be between about 2 Torr and about 6 Torr while operation 110 may be performed at a chamber pressure between about 0.6 Torr and about Torr. In some embodiments, chamber pressure during operation 140 may be the same as during that of operation Example process condition sets for achieving certain properties are provided below.

For modulating wet etch rate (as measured by dipping for 60 seconds in 100:1 dilute hydrofluoric acid (HF)), the intermittent plasma treatment can be performed by introducing a mixture of argon and oxygen gas, the argon gas delivered at a flow rate between about 5 slm and about 50 slm, and the oxygen gas delivered at a flow rate between about 500 sccm and about 10000 sccm using an argon to oxygen ratio of between about 50:1 and about 1:10, and between about 50:1 and about 100:1 or about 36:1 and igniting a plasma using a plasma power between about 50 W and about 6500 W or between about 3000 W and about 6500 W for a 4-station tool, or about 5000 W for a 4-station tool for high frequency plasma. For low frequency plasma, the plasma power for a 4-station tool may be between about 50 W and about 4500 W, or between about 50 W and about 2000 W. In some embodiments, plasma power during operation 110 is less than plasma power during operation 140. The chamber pressure may be set to between about 0.6 Torr and about 20 Torr, or between about 1 Torr to about 5 Torr, and the intermittent plasma treatment can be performed for a duration between about 0.1 seconds and about 30 seconds. The longer the intermittent plasma treatment duration, the lower the wet etch rate. In various embodiments, such intermittent plasma treatment is performed every 15 cycles of ALD, or every less than 15 cycles of ALD. The wet etch rate achieved may be less than about 40 Å, or as low as about 30 Å/min in 100:1 HF.

In one non-limiting example of modulating wet etch rate (as measured by dipping for 60 seconds in 100:1 dilute HF), the intermittent plasma treatment can be performed by introducing a mixture of argon, hydrogen, and oxygen gas where the ratio of flow rate of argon to flow rate of hydrogen is between about 50:1 and about 1:1 and the ratio of flow rate of argon to flow rate of oxygen is between about 50:1 and about 1:1.

In one non-limiting example of modulating wet etch rate (as measured by dipping for 60 seconds in 100:1 dilute HF), the intermittent plasma treatment can be performed by introducing a mixture of argon, oxygen, nitrous oxide, and helium where the ratio of flow rate of argon to oxygen is between about 50:1 and about 1:1, the ratio of flow rate of argon to flow rate of nitrous oxide is between about 10:1 and about 20:1 and the ratio of flow rate of argon to flow rate of helium is between about 10:1 and about 20:1.

In one non-limiting example of modulating wet etch rate (as measured by dipping for 60 seconds in 100:1 dilute HF), the intermittent plasma treatment can be performed by introducing a mixture of argon, oxygen, and nitrous oxide where the ratio of flow rate of argon to flow rate of oxygen is between about 50:1 and about 1:1, and the ratio of flow rate of argon to flow rate of nitrous oxide is between about 10:1 and about 20:1.

For modulating film stress, the intermittent plasma treatment can be performed by introducing a mixture of argon and oxygen gas and optionally one or more inert gases such as hydrogen gas or nitrous oxide gas. The mixture of gases delivered does not include ammonia for certain embodiments of modulating film stress. The film stress achieved may be less than about −290 MPa, or less than about 55 MPa, or between about −290 MPa and about 55 MPa. The argon gas can be delivered at a flow rate between about 5 slm and about 50 slm, and the oxygen gas can be delivered at a flow rate between about 1000 sccm and about 10000 sccm using an argon to oxygen ratio of between about 50:1 and about 1:10, and between about 50:1 and about 100:1 or about 36:1 and igniting a plasma using a plasma power between about 1000 W and about 2000 W for a 4-station tool, or about 1200 W for a 4-station tool. The chamber pressure may be set to about 1 Torr to about 20 Torr, or about 10 Torr, and the intermittent plasma treatment can be performed for a duration between about 1 second and about 20 seconds, or about 5 seconds to about 10 seconds. In various embodiments, such intermittent plasma treatment is performed every 15 cycles of ALD, or every less than 15 cycles of ALD. The combination of reduced plasma power and chamber pressure helps achieve lower stress films.

In one non-limiting example of modulating film stress, the intermittent plasma treatment can be performed by introducing a mixture of argon, oxygen, and nitrous oxide where the ratio of flow rate of argon to flow rate of oxygen is between about 50:1 and about 1:1, and the ratio of flow rate of argon to flow rate of nitrous oxide is between about 10:1 and about 20:1.

For modulating electrical properties of the deposited film, the intermittent plasma treatment can be performed by introducing a mixture of argon, helium, oxygen gas, and one or more of hydrogen gas and nitrous oxide. Electrical properties of a film can be determined by using a mercury probe analytical tool to determine current leakage and breakdown voltage. Certain disclosed embodiments are capable of depositing films having a breakdown voltage of greater than about 10 MW/cm. During intermittent plasma treatment, hydrogen gas can be used to improve particular properties and reduce leakage and increase breakdown voltage in films such as thermal oxide films. The argon gas is delivered at a flow rate between about 5 slm and about 50 slm, and the oxygen gas is delivered at a flow rate between about 500 sccm and about 10000 sccm using an argon to oxygen ratio of between about 50:1 and about 1:10, and between about 50:1 and about 100:1 or about 36:1 and igniting a plasma using a plasma power between about 3000 W and about 6500 W for a 4-station tool, or about 5000 W for a 4-station tool. The chamber pressure may be set to about 1 Torr to about 5 Torr, and the intermittent plasma treatment can be performed for a duration between about 0.1 seconds and about 30 seconds. This particular combination of plasma power and chamber pressure helps achieve reduced leakage and improved breakdown voltage.

In one non-limiting example of modulating electrical properties of the deposited film, the intermittent plasma treatment can be performed by introducing a mixture of argon, oxygen, and nitrous oxide where the ratio of flow rate of argon to flow rate of oxygen is between about 50:1 and about 1:1, and the ratio of flow rate of argon to flow rate of nitrous oxide is between about 10:1 and about 20:1.

The longer the intermittent plasma treatment duration, the lower the wet etch rate. In various embodiments, such intermittent plasma treatment is performed every 15 cycles of ALD, or every less than 15 cycles of ALD.

For modulating film impurities (e.g., impurities of carbon, nitrogen, and/or fluorine atoms), the intermittent plasma treatment can be performed by introducing a mixture of argon, hydrogen, and optionally oxygen gas. Film impurities can be determined by obtaining an IR spectrum of the as-deposited film.

In one non-limiting example of modulating film impurities, the intermittent plasma treatment can be performed by introducing a mixture of argon, hydrogen, and oxygen gas where the ratio of flow rate of argon to flow rate of hydrogen is between about 50:1 and about 1:1 and the ratio of flow rate of argon to flow rate of oxygen is between about 50:1 and about 1:1.

In one non-limiting example of modulating film impurities, the intermittent plasma treatment can be performed by introducing a mixture of argon, oxygen, nitrous oxide, and helium where the ratio of flow rate of argon to oxygen is between about 50:1 and about 1:1, the ratio of flow rate of argon to flow rate of nitrous oxide is between about 10:1 and about 20:1 and the ratio of flow rate of argon to flow rate of helium is between about 10:1 and about 20:1.

For modulating elemental composition of the deposited film, the intermittent plasma treatment can be performed in combination with an inhibition or passivation operation using a fluorine-containing gas. An inhibition or passivation operation can help provide more control over a deposition fill process of ALD. Details of an example process are described below with respect to operation 260 of FIG. 2. The intermittent plasma treatment can be performed by introducing a treatment gas mixture.

The treatment gas mixture may include helium and one or more of argon, oxygen, and hydrogen gas. The flow rate of helium may be between about 1000 sccm and about 10000 sccm, the flow rate of argon may be between about 500 sccm and about 20000 sccm, the flow rate of oxygen may be between about 1000 sccm and about 10000 sccm, and the flow rate of hydrogen may be between about 500 sccm and about 5000 sccm. The treatment gas mixture is introduced and a plasma is ignited using a plasma power between about 1000 W and about 1500 W for a 4-station tool for a 4-station tool. The chamber pressure may be set to about 5 Torr to about 10 Torr, or about 6 Torr, and the intermittent plasma treatment can be performed for a duration between about 1 second and about 10 seconds.

The treatment gas mixture may include argon, hydrogen, and oxygen, with gas flow ratios of $Ar:H_2:O_2$ of about 50:1:1 to about 1:1:1, such as about 5:1:1, with no nitrous oxide or helium gas.

The treatment gas mixture may include argon, nitrous oxide, and helium, with gas flow ratios of $Ar:N_2O:He$ of about 1:1:0.2 to about 0.2:0.5:0.2, such as about 0.2:0.5:0, with no hydrogen or oxygen gas.

For achieving a void-free fill of material, the intermittent plasma treatment can be performed by introducing a mixture of argon and oxygen gas. The argon gas can be delivered at a flow rate between about 10 slm and about 150 sccm, or about 50 slm, and the oxygen gas can be delivered at a flow rate between about 1 slm to about 10 slm using an argon to oxygen ratio of about 1.5:1 and igniting a plasma using a plasma power between about 1000 W and about 2000 W for a 4-station tool, or about 1200 W for a 4-station tool. The chamber pressure may be set to about 1 Torr to about 10 Torr, and the intermittent plasma treatment can be performed for a duration between about 1 second and about 20 seconds, or about 5 seconds to about 10 seconds.

In operation 150, operations 110-140 may be repeated. That is, operation 150 is performed every n cycles of ALD, and the overall n cycles of ALD and intermittent plasma treatment can be repeated. Disclosed embodiments are suitable for depositing any material using ALD, such as oxides, nitrides, and carbides of silicon.

Further examples of in-situ modulated ALD process cycles are provided herein. FIG. shows an example process cycle including an ALD cycle with intermittent plasma treatment and optional inhibition operations which may be used in some embodiments. FIG. 3 corresponds to example timing schematic diagram FIG. 2 without the optional inhibition operation; the timing schematic in FIG. 3 provides the various pulses and flows for the ALD cycles and periodic intermittent plasma treatment repeated once.

Embodiments herein are described with respect to deposition of silicon oxide but it will be understood that similar processes may be used for depositing other silicon-containing films.

Figure 2:
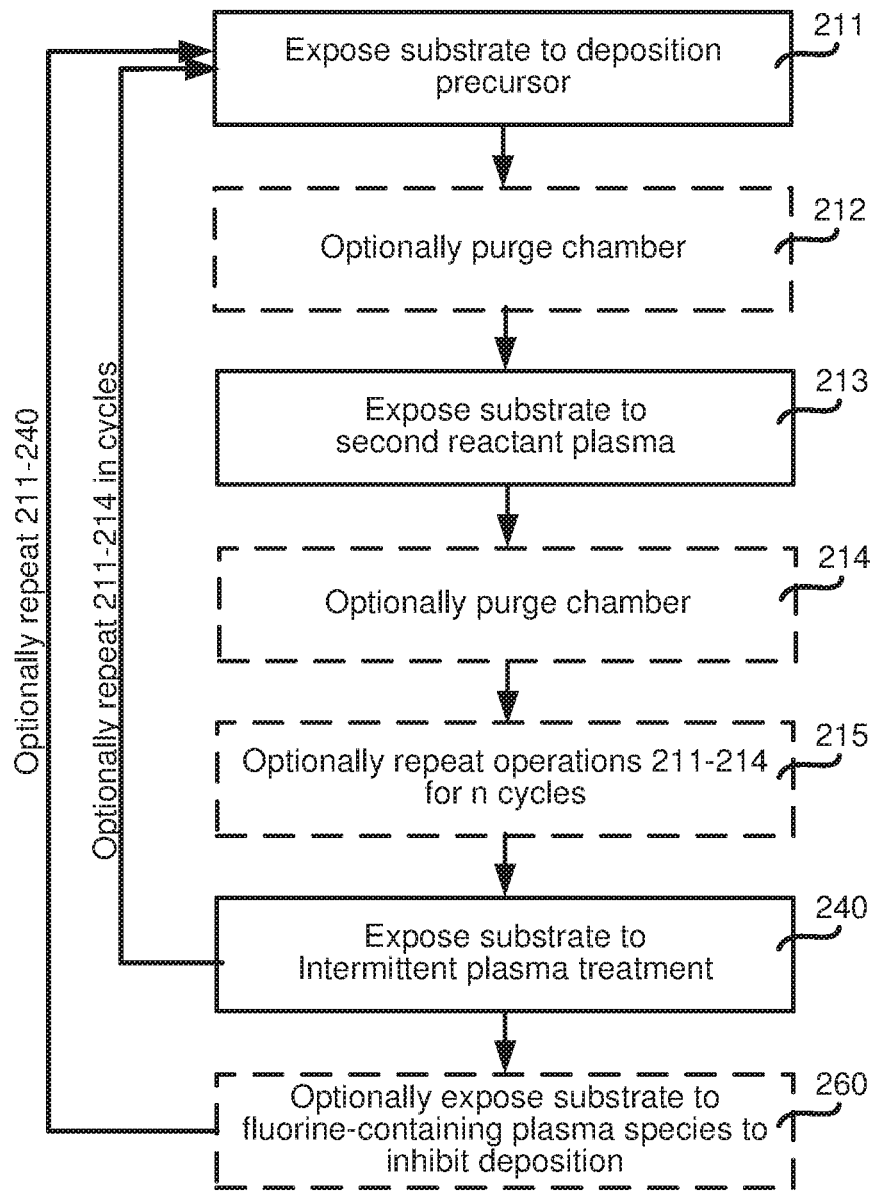
Figure 3:
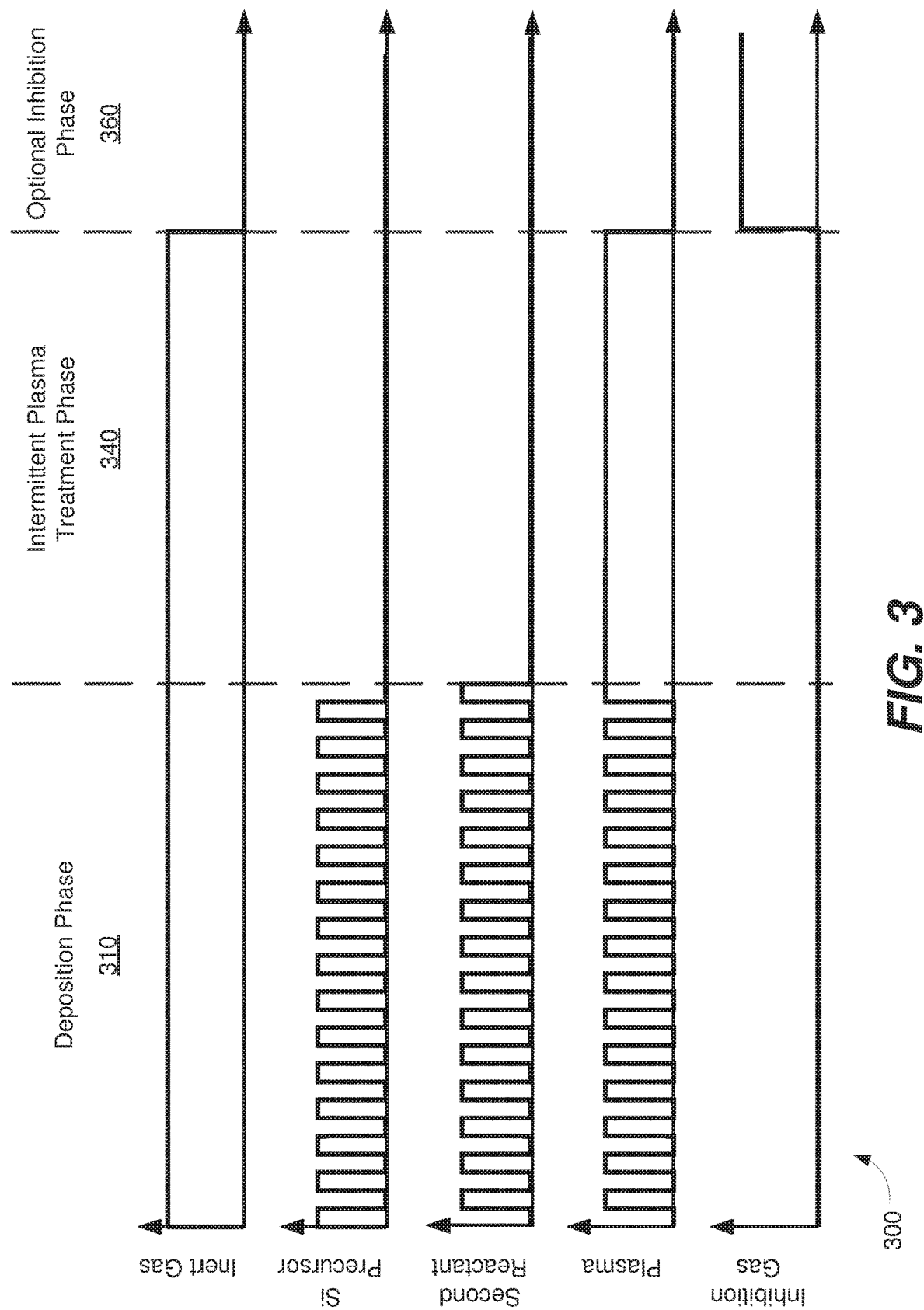
FIG. 3 is a timing sequence diagram showing an example of a method in accordance with certain disclosed embodiments.

In operation 211 of FIG. 2, a substrate is exposed to a deposition precursor. In various embodiments, the substrate is provided to a chamber prior to exposing to a deposition precursor such that the deposition precursor is introduced to the chamber to expose the substrate to the deposition precursor. In various embodiments, the chamber itself includes a controller, further described below with respect to FIG. 4 that includes machine-readable instructions for causing delivery of a deposition precursor to a chamber in which the substrate is housed.

The substrate may be a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In various embodiments, the substrate is patterned. A patterned substrate may have "features" such as via or contact holes, which may be characterized by one or more of narrow and/or re-entrant openings, constrictions within the feature, and various aspect ratios including high aspect ratios. One or more features may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the feature may have an aspect ratio of at least about 1:1, at least about 2:1, at least about 4:1, at least about 6:1, at least about 10:1, or higher. The feature may also have a dimension near the opening, e.g., an opening diameter or line width of between about 10 nm to 10 μm, for example between about 25 nm and about 1 μm. Disclosed methods may be performed on substrates with features having an opening less than about 250 nm. A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the bottom of the feature.

During operation 211, the substrate is exposed to the deposition precursor. In various embodiments, the substrate is exposed for a duration sufficient to adsorb the deposition precursor onto the surface of the substrate. In some embodiments, the substrate may be exposed to a precursor for a duration sufficient to saturate less than 100% of the substrate surface. Example durations depend on wafer chemistry, type of precursor, precursor flow rate, patterns on the wafer, and other factors. Duration may be selected depending on the desired properties of the material. In some embodiments, the substrate may be exposed during operation 211 for a duration less than about 5 seconds, or between about 0.05 second and about 3 seconds. For deposition of oxides, the dose time may be between about 0.05 seconds and about 0.5 seconds. The deposition precursor is selected depending on the type of material to be deposited. For example, to deposit a silicon nitride or a silicon oxide film, a silicon-containing precursor may be used during operation 211.

During operation 211, the one or more process gases may be introduced. In some embodiments, the deposition precursor is a silicon-containing precursor, such as silane. A silicon-containing precursor used in certain methods described herein may have the structure:

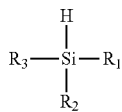

where R1, R2, and R3 may be the same or different substituents, and may include silanes, amines, halides, hydrogen, or organic groups, such as alkylamines, alkoxy, alkyl, alkenyl, alkynyl, and aromatic groups.

Example silicon-containing precursors include polysilanes (H3Si—(SiH2)n-SiH3), where n>1, such as silane, disilane, trisilane, tetrasilane; and trisilylamine:

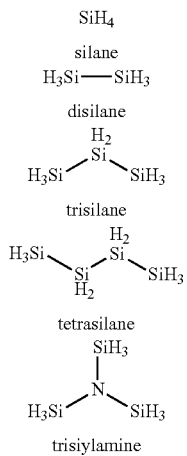

In some embodiments, the silicon-containing precursor is an alkoxysilane. Alkoxysilanes that may be used include, but are not limited to, the following:

$H_x$—Si—$(OR)_y$ where x=1-3, x+y=4 and R is a substituted or unsubstituted alkyl group; and $H_x(RO)_y$—Si—Si—$(OR)$—$H_x$ where x=1-2, x+y=3 and R is a substituted or unsubstituted alkyl group.

Examples of silicon-containing precursors include: methylsilane; trimethylsilane (3 MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyl-diethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

In some embodiments, the silicon-containing precursor may be an aminosilane, with hydrogen atoms, such as bisdiethylaminosilane, diisopropylaminosilane, tert-butylamino silane (BTBAS), or tris(dimethylamino)silane. Aminosilane precursors include, but are not limited to, the following: $H_x$—Si—$(NR)_y$, where x=0-3, x+y=4 and R is an organic or hydride group. In some embodiments, the silicon-containing precursor is a tetrakisaminosilane, such as tetrakis(dimethylamino)silane (4DMAS).

In some embodiments, a halogen-containing silane may be used such that the silane includes at least one hydrogen atom. Such a silane may have a chemical formula of $SiX_aH_y$, where y≥1. For example, dichlorosilane ($H_2SiCl_2$) may be used in some embodiments.

In addition to a silicon-containing precursor, one or more other gases, including inert gases such as argon, nitrogen, helium, hydrogen, or combinations thereof, may also be flowed. In various embodiments, argon gas may be introduced using a flow rate between about 1 slm and about 20 slm. In some embodiments, nitrogen gas is introduced using a flow rate between about slm and about 30 slm (with the understanding that 0 slm refers to no nitrogen gas being flowed). In some embodiments, hydrogen gas is introduced using a flow rate between about 0 slm and about slm (with the understanding that 0 slm refers to no hydrogen gas being flowed). During operation 211, the chamber pressure may be between about 0.6 Torr and about 10 Torr and a pedestal holding the substrate being processed may be set to a temperature between about 150° C. and about 650° C., or between about 150° C. and about 550° C., or between about 200° C. and about 650° C., or between about 550° C. and about 650° C.

In operation 212, the chamber housing the substrate is optionally purged to remove excess precursor molecules in gas phase that did not adsorb onto the surface of the substrate. Purging may involve a purge or sweep gas, which may be a carrier gas used in other operations or a different gas. In some embodiments, the purge gas may be nitrogen, argon or other inert gas, oxygen, nitrous oxide, a combination of inert gases, or combinations thereof. In some embodiments, the argon gas is introduced using a flow rate between about 1 slm and about 20 slm, and nitrogen gas may be flowed using a flow rate between about 0 slm and about 30 slm, hydrogen gas may be flowed using a flow rate between about 0 slm and about 5 slm, and in some embodiments, some oxygen may also be flowed using a flow rate between 0.5 slm and about 5 slm. In some embodiments, nitrous oxide may also be flowed using a flow rate between about 0 slm and about 5 slm.

In some embodiments, the purge gas is the same chemistry as the carrier gas used during precursor doses. In some embodiments, the purge gas is the same gas flowed during a plasma operation as further described below. In some embodiments, the purge gas is flowed from the same gas source from where carrier gas is flowed. In some embodiments, purging may involve evacuating the station. In some embodiments, a purge may include one or more evacuation purges for evacuating the process station. In some embodiments, the purge may be performed for any suitable duration, such as between about 0 seconds and about 60 seconds, or between about 0 seconds and about 0.8 seconds. In some embodiments, increasing a flow rate of a one or more sweep gases may decrease the duration of the purge. For example, a purge gas flow rate may be adjusted according to various reactant thermodynamic characteristics and/or geometric characteristics of the process station and/or process station plumbing for modifying the duration of operation 212. In one non-limiting example, the duration of a sweep phase may be adjusted by modulating sweep gas flow rate. This may reduce deposition cycle time, which may improve substrate throughput. After a purge, some precursor molecules may remain adsorbed onto the substrate surface.

The chamber pressure during operation 212 may be between about 0.6 Torr and about 10 Torr, and in some embodiments may be the same as during operation 211. The temperature of the pedestal may be set to a temperature between about 50° C. and about 650° C., or between about 50° C. and about 550° C., between about 150° C. and about 650° C., or between about 150° C. and about 550° C., or between about 200° C. and about 650° C., or between about 550° C. and about 650° C. In some embodiments, the temperature is the same as during operation 211.

In operation 213, the substrate is exposed to a second reactant plasma, which may be generated by introducing a second reactant and igniting a plasma. In various embodiments, the second reactant is an oxygen-containing reactant. The oxygen-containing reactant may be oxygen, nitrous oxide, water, carbon dioxide, or combinations thereof. The substrate may be exposed to a second reactant capable of reacting with the precursor to form a material on the surface of the substrate while a plasma is ignited to catalyze the reaction. The second reactant may be selected depending on the type of film to be deposited. For a silicon oxide film, the substrate may be exposed to an oxygen-containing reactant or an oxidant while a plasma is ignited in operation 213 to deposit a silicon oxide film. In various embodiments, the second reactant is oxygen gas. In some embodiments, the second reactant includes two or more gases, such as a mixture of oxygen and nitrous oxide gas.

In some embodiments, the argon gas is introduced using a flow rate between about 1 slm and about 20 slm, and nitrogen gas may be flowed using a flow rate between about 0 slm and about 30 slm, hydrogen gas may be flowed using a flow rate between about 0 slm and about 5 slm, and in some embodiments, some oxygen may also be flowed using a flow rate between 0.5 slm and about 5 slm. In some embodiments, nitrous oxide may also be flowed using a flow rate between about 0 slm and about 5 slm.

Plasma energy may be provided to activate the second reactant into ions and radicals and other activated species, which react with the adsorbed layer of the deposition precursor. In various embodiments, the plasma is an in-situ plasma, such that the plasma is formed directly above the substrate surface in the chamber. The in-situ plasma may be ignited at a power per substrate area between about 0.2122 W/cm$^2$ and about 2.122 W/cm$^2$, or between about 0.4421 W/cm$^2$ and about 1.7684 W/cm$^2$. For example, the power for a single wafer may range from about 150 W to about 6000 W, or from about 500 W to about 6000 W, or from about 600 W to about 6000 W, or from about 800 W to about 4000 W, or from about 310 W to about 1250 W. The power for four 300 mm wafers may range from about 150 W to about 6000 W, or from about 1250 W to about 5000 W. Ranges described herein are inclusive of their end points.

Plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed.

The chamber pressure during operation 213 may be between about 0.6 Torr and about 10 Torr, and in some embodiments may be the same as during operation 211 and 212. The temperature of the pedestal may be set to a temperature between about 50° C. and about 650° C., between about 150° C. and about 650° C., or between about 150° C. and about 550° C., or between about 200° C. and about 650° C., or between about 550° C. and about 650° C. In some embodiments, the temperature is the same as during operation 211 and 212.

In operation 214, the chamber is again optionally purged. The purge conditions in some embodiments may be the same as the purge conditions in operation 212. In some embodiments, purge conditions may be varied. For purposes of this example, the purge conditions may be the same as those in operation 212.

In operation 215, operations 211-214 are optionally repeated for n cycles, where n is an integer equal to or greater than 1, such as between 1 and 200 cycles. The number of cycles may depend on the desired thickness of the film being deposited. Operations 211-214 may constitute one ALD cycle.

In operation 240, the substrate is exposed to an intermittent plasma treatment. The intermittent plasma treatment may be performed using process conditions and chemistries described above with respect to operation 140 of FIG. 1. In some embodiments. In various embodiments, the intermittent plasma treatment is performed every 5 to every 10 cycles of ALD, depending on the particular application. For example, in some embodiments, film stress, fluorine content, and breakdown voltage can be modulated by performing the intermittent plasma treatment every 10 ALD cycles. In some embodiments, wet etch rate can be improved by performing the intermittent plasma treatment every 5 ALD cycles.

The process conditions of the intermittent plasma treatment, including duration of treatment, frequency of treatment per number of ALD cycles, and gas flow rates used during treatment, can be modulated to achieve desired results, including reduced stress, reduced wet etch rate, reduced fluorine content, reduced dielectric k-value, and improved breakdown voltage tolerance. The wet etch rate achieved may be less than about 40 Å, or as low as about 30 Å/min in 100:1 HF.

In some embodiments, the argon gas is introduced using a flow rate between about 1 slm and about 20 slm, and nitrogen gas may be flowed using a flow rate between about 0 slm and about slm, hydrogen gas may be flowed using a flow rate between about 0 slm and about 5 slm, and in some embodiments, some oxygen may also be flowed using a flow rate between 0.5 slm and about 5 slm. In some embodiments, nitrous oxide may also be flowed using a flow rate between about 0 slm and about 5 slm.

The chamber pressure during operation 240 may be between about 0.6 Torr and about 10 Torr, and in some embodiments may be the same as during operations 211-214. In some embodiments, the chamber pressure during operation 240 is between about 2 Torr and about 10 Torr or between about 2 Torr and about 6 Torr. The temperature of the pedestal may be set to a temperature between about 50° C. and about 650° C., between about 150° C. and about 650° C., or between about 150° C. and about 550° C., or between about 200° C. and about 650° C., or between about 550° C. and about 650° C. In some embodiments, the temperature is the same as during operations 211-214.

The duration of operation 240 may be between about 0.02 seconds and about 120 seconds.

In some embodiments, intermittent plasma treatment can be used to improve deposition in small features by using inhibition in combination with ALD and intermittent plasma treatment. In such embodiments, in operation 260, the substrate is optionally exposed to a fluorine-containing plasma species to inhibit deposition. An example process scheme may be as follows for filling features on a substrate: ALD is performed by exposing the substrate to alternating pulses of a silicon-containing precursor and an oxygen-containing reactant to deposit silicon oxide that partially fills the features, followed by intermittent plasma treatment on the deposited ALD-deposited film, followed by inhibition on surfaces at or near openings of features by exposing the substrate to a dose of fluorine ions and radicals generated from fluorine plasma to form a fluorine-terminated silicon surface that prevents deposition in subsequent ALD cycles, followed by repeating of the above process scheme in cycles (multiple ALD cycles, followed by intermittent plasma treatment, followed by inhibition) to deposit silicon oxide into features.

As shown in FIG. 2, operations 211-240 may be optionally repeated, and operations 211-260 (which may include multiple cycles of operations 211-214) may be repeated in multiple cycles.

Intermittent plasma treatment in embodiments involving inhibition may be used to control the extent of inhibition from the exposure to fluorine-containing ions and radicals; that is, intermittent plasma treatment can balance the inhibition to allow more active sites and provide an additional knob to fine-tune the deposition process, particularly in embodiments where inhibition may slow down the deposition too much but may still be used to ensure a bottom-up fill of features.

FIG. 3 is an example timing schematic diagram showing a process having a deposition scheme involving inhibition for a feature fill application. Process 300 shows one complete cycle including multiple deposition cycles in the deposition phase 310, followed by periodic intermittent plasma treatment phase 340, and optional inhibition phase 360. The lines indicate when the flow and/or plasma, as appropriate, are turned on and off. While certain process conditions are depicted in FIG. 3, it will be understood that other process parameters may also be modulated depending on the particular application of the film being deposited. It will also be understood that while the example in FIG. 3 involves an inhibition phase 360, such phase may not be present in certain embodiments. While process 300 in FIG. 3 includes only one cycle, it will be understood that the shown cycle may be repeated in multiple cycles to deposit a film.

Deposition phase 310 of FIG. 3 may correspond to any one of operations 110, 120, or of FIG. 1, or may correspond to performing operations 211-214 in FIG. 2. During deposition phase 310, an inert gas may be flowed and alternating pulses of a silicon precursor and oxygen-containing reactant are performed while plasma is generated during the oxygen-containing reactant pulse. During this operation, the inhibition gas flow is turned off. While many pulses are shown for the deposition phase, it will be understood that the number of pulses may vary depending on the film to be deposited.

In periodic intermittent plasma treatment phase 340, the inert gas may continue to flow, while the silicon precursor gas flow and oxygen-containing gas flows are turned off. Plasma is turned on and is ignited continuously in the presence of the inert gas to treat the deposited film and the inhibition gas flow remains off.

In optional inhibition phase 360, the inert gas may, in some embodiments, be turned off (although it will be understood that in some cases, the inert gas flow may remain on). Silicon precursor flow and oxygen-containing gas flow remains off, and plasma is turned off. Here, the inhibition gas flow is then turned on.

Although not depicted, the cycle shown in process 300 may be repeated for multiple cycles as desired.

While silicon oxide is described, it will be understood that disclosed embodiments may be equally applicable to forming doped silicon oxides, n-type semiconductors, p-type semiconductors, silicon oxynitride, boron-doped silicon oxide, and other materials.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes.

Apparatus

Figure 4:
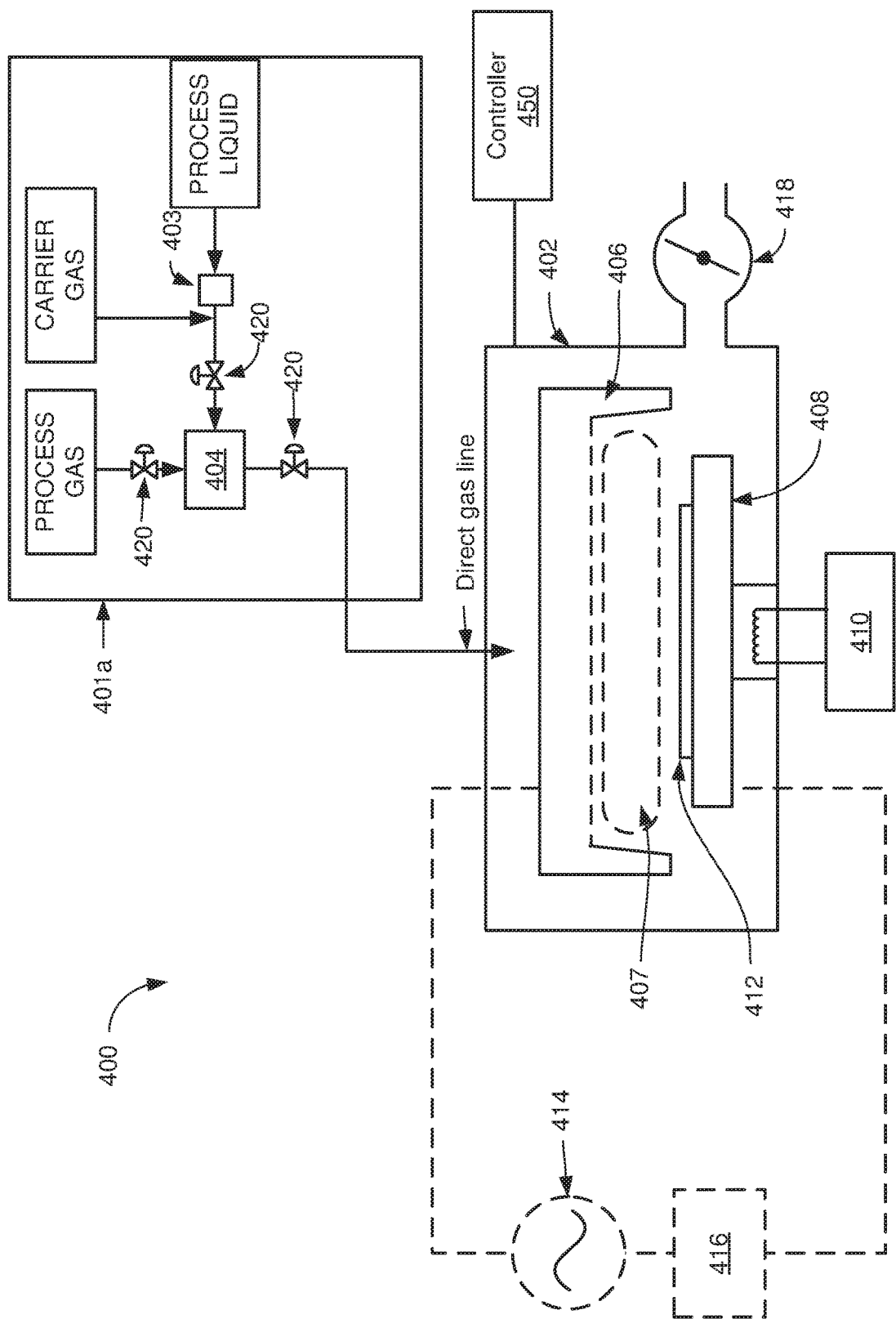
FIG. 4 is a schematic diagram of an example process chamber for performing certain disclosed embodiments.

FIG. 4 depicts a schematic illustration of an embodiment of an atomic layer deposition (ALD) process station 400 having a process chamber body 402. The ALD process station 400 may be suitable for processing substrates in a low-pressure environment in some embodiments. In some embodiments, one or more hardware parameter values of ALD process station 400, including those discussed in detail below may be adjusted programmatically by one or more computer controllers 450. In various embodiments, intermittent plasma treatments are performed in situ after deposition of a film in the ALD process station as described herein. Variation of the parameter values may be made in a determined manner or based on real-time feedback. Additional examples and further embodiments are described below.

ALD process station 400 fluidly communicates with reactant delivery system 401a for delivering process gases to a distribution showerhead 406. Reactant delivery system 401a includes a mixing vessel 404 for blending and/or conditioning process gases for delivery to showerhead 406. For example, the reactant delivery system 401a may include mass flow controllers and liquid flow controllers as described below. One or more mixing vessel inlet valves 420 may control introduction of process gases to mixing vessel 404. In various embodiments, delivery of one or more process gases to the showerhead 406 or to the process chamber 402 may be varied across cycles. For example, the duration of dosing one or more process gases may be varied. In disclosed embodiments, a controller 450 may control the delivery of one or more process gases by controlling one or more inlet valves 420.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 30° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

In some embodiments, a flow-over-vapor process may be used. A discussion of such processes are described in U.S. Patent Application Publication No. 2019/0024233, filed on Sep. 20, 2018, and titled "DYNAMIC PRECURSOR DOSING FOR ATOMIC LAYER DEPOSITION." In some embodiments of flow-over-vapor processes, the timing of the valve operations may be set using line charge time, adsorption time, or some other time. Moreover, the frame of reference for the operation of the valves may be the start of a dose step, the stop of a dose step, any other event during a dose step, and/or any event during an ALD cycle.

In some implementations, an amount of precursor may be sent through the gas line that may be more than necessary for a desired adsorption amount. This additional precursor may also be sent such that it arrives before the beginning of the dose step, after the dose step, and/or after the desired adsorption/saturation has been achieved. In some such implementations, some precursor may be dumped to the foreline before and/or after the dose step. In some such implementations, duration of time for which the ampoule valve may be open, the timing of when the ampoule valve may open and/or close, the duration of time for which the chamber valve may be open, and/or the timing of when the chamber valve may be open may vary. However, to reduce waste, the excess precursor may be limited to about 20% or less (or about 10% or less) of the amount required for adsorption/saturation.

Furthermore, in some implementations, each event (e.g., the opening of the ampoule valve, the closing of the chamber valve) may not occur precisely at an intended time point.

Moreover, the timing of the valves may not be exactly equal to the line charge time and/or adsorption time. There may also be a timing delay to account for delays of the system, such as the time it takes a valve to open or close. In some embodiments, an ALD valve may be used which may have a timing delay of 25 milliseconds. There may also be a margin of error within the implementations herein which may also be 25 milliseconds.

In some embodiments, a dynamic feedback loop may be created in order to deliver exactly the same number of moles of precursor per cycle desired for each cycle, which may be below, equal to, or greater than the adsorption amount. The amount of precursor delivered in a flow-over-vapor system, such as described herein, may depend on several factors including ampoule temperature, headspace pressure, and push gas flow. If one or more of these parameters deviates from the intended set points over the course of the deposition period (for example, due to precursor level changing in the ampoule), the amount of delivered precursor per ampoule valve open time will deviate accordingly. A feedback loop may be created by, among other things, sensor data (e.g. measurements) from, for instance, ampoule thermocouples, pressure gauges, and MFC's, and a controller. In one example, a pressure gauge (e.g., a manometer) is located at the entrance to the process chamber (e.g., by one of the inlet valves 420). The arrival of precursor at the process chamber may be signaled by a pressure variation detected by the pressure gauge. By dynamically controlling the ampoule open/close timing based on such feedback loop, precursor delivery can be made more robust and repeatable cycle-to-cycle. The feedback loop, measurements, and/or adjustments may be made during a dose/deposition step, between steps in a cycle, between cycles, and/or between processes.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, a microvolume 407 is located beneath showerhead 406. Practicing disclosed embodiments in a microvolume rather than in the entire volume of a process station may reduce reactant exposure and purge times, may reduce times for altering process conditions (e.g., pressure, temperature, etc.), and may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 408 may be raised or lowered to expose substrate 412 to microvolume 407 and/or to vary a volume of microvolume 407. For example, in a substrate transfer phase, pedestal 408 may be raised to position substrate 412 within microvolume 407. In some embodiments, microvolume 407 may completely enclose substrate 412 as well as a portion of pedestal 408 to create a region of high flow impedance.

Optionally, pedestal 408 may be lowered and/or raised during portions the process to modulate process pressure, reactant concentration, etc., within microvolume 407. In one scenario where process chamber body 402 remains at a base pressure during the process, lowering pedestal may allow microvolume 407 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 450. In some embodiments, location of the pedestal 408 may be varied across cycles. For example, in some ALD cycles, the pedestal 408 may be raised, and in some ALD cycles, the pedestal 408 may be lowered. Variations as described herein may be dependent on real-time feedback or a determined recipe.

In another scenario, adjusting a height of pedestal 408 may allow a plasma density to be varied during plasma activation and/or deposition cycles included in disclosed multi-cyclic ALD processes. At the conclusion of the process phase, pedestal 408 may be lowered during another substrate transfer phase to allow removal of substrate 412 from pedestal 408.

While the example microvolume variations described herein refer to a height-adjustable pedestal, it will be appreciated that, in some embodiments, a position of showerhead 406 may be adjusted relative to pedestal 408 to vary a volume of microvolume 407. Further, it will be appreciated that a vertical position of pedestal 408 and/or showerhead 406 may be varied by any suitable mechanism within the scope of the present disclosure. In some embodiments, pedestal may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. Such parameter values may be varied from ALD cycle to ALD cycle in a multi-cyclic ALD process as described herein. For example, RF power supply 414 and matching network 416 may be operated at any suitable power to form a plasma having a desired composition of radical species during one or more ALD cycles. Examples of suitable powers are included above. Likewise, RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameter values may be modulated discretely or continuously to provide plasma energy for the surface reactions. In one non-limiting example, the plasma power may be intermittently pulsed to reduce ion bombardment with the substrate surface relative to continuously powered plasmas. In some embodiments, the plasma power can be between about 50 W and about 6000 W. In various embodiments, the RF power or RF frequency or both may be used for both deposition and intermittent plasma treatment. The RF power and/or frequency may be modulated to change the properties of the deposited film, such as wet etch rate, stress, fluorine concentration, dielectric k-value, and breakdown voltage tolerance.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameter values may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameter values may be included in a recipe phase. For example, a first recipe phase may include instructions for setting a flow rate of an inert and/or a reactant gas (e.g., the first precursor such as silane), instructions for setting a flow rate of a carrier gas (such as nitrogen or argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for setting a flow rate of an inert and/or reactant gas which may be the same as or different from the gas used in the first recipe phase (e.g., the second precursor such as oxygen), instructions for setting a plasma RF power, instructions for modulating a flow rate of a carrier gas which may be the same as or different from the flow rate in the first recipe phase, plasma conditions, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. A fifth recipe phase may include instructions for setting a flow rate of an inert and/or reactant gas (e.g., the oxygen and/or argon), instructions for setting a different or same plasma RF power, instructions for modulating a flow rate of a carrier gas, plasma conditions, and time delay instructions for the fifth recipe phase for performing an intermittent plasma treatment. In some cases, the recipe phase may also include instructions for pulsing the plasma between ON and OFF states. More recipe phases may also be used. It will be appreciated that these recipe phases may be further subdivided and/or iterated in any suitable way within the scope of the present disclosure.

In some embodiments, pedestal 408 may be temperature controlled via heater 410. Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400. The process station 400 may include a control 450 for controlling example recipes as described above.

In some implementations, a controller 450 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 450, depending on the processing requirements and/or the type of system, may be programmed to control any of the processes disclosed herein, including the delivery of processing gases and/or variation of different dose times for delivery of process gases including diversion of one or more gases, temperature settings (e.g., heating and/or cooling), pressure settings, vacuum settings, power settings, radio frequency (RF) generator settings and/or variation of RF power settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 450, in some implementations, may be a part of or coupled to a computer that is integrated with, coupled to the system, otherwise networked to the system, or a combination thereof. For example, the controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 450 receives instructions in the form of data, which specify parameters for each of the processing steps to be performed during one or more operations. It should be understood that the parameters may be specific to the type of process to be performed and the type of tool that the controller 450 is configured to interface with or control. Thus as described above, the controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5:
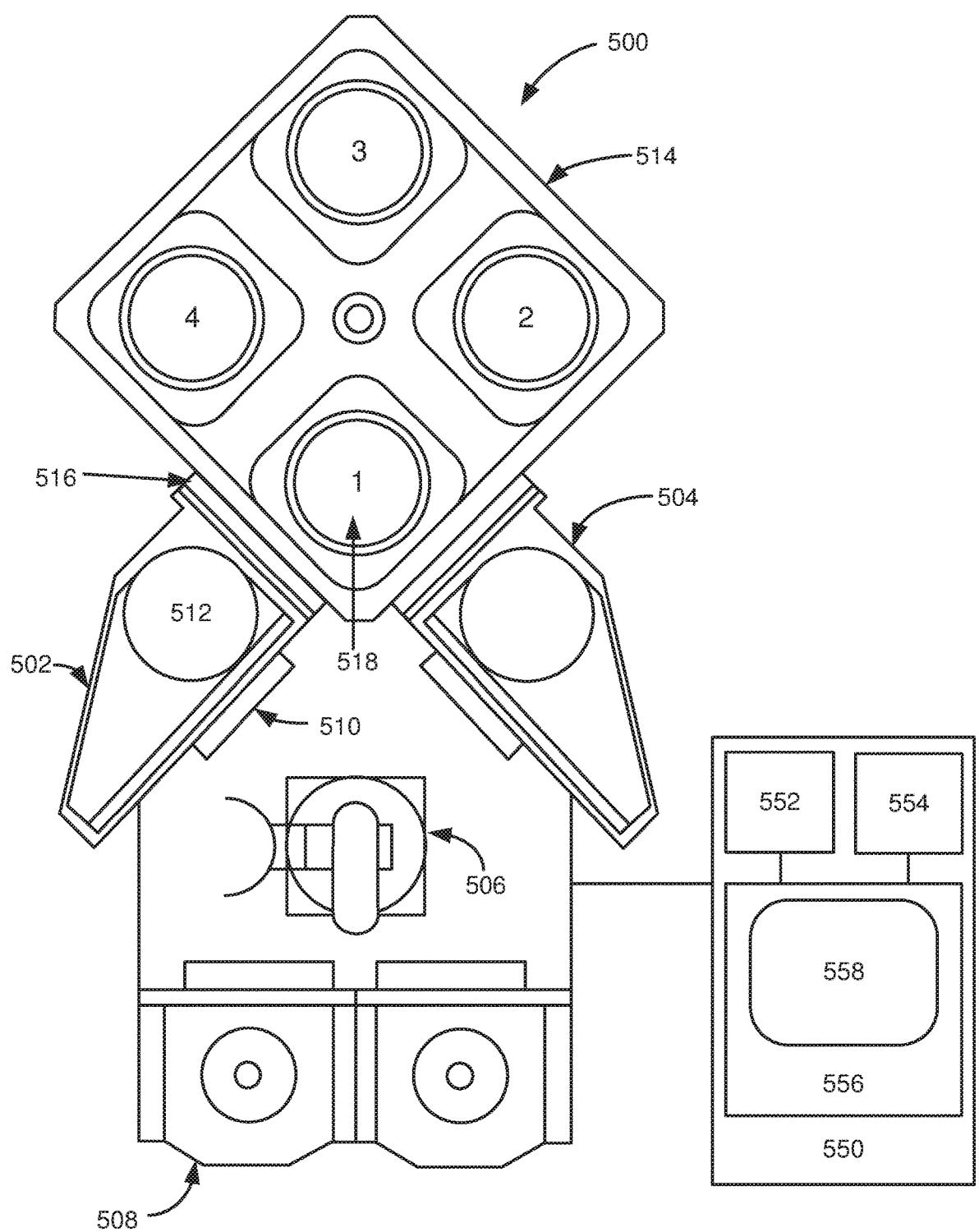
FIG. 5 is a schematic diagram of an example process tool for performing certain disclosed embodiments.

As described above, one or more process stations may be included in a multi-station processing tool. FIG. 5 shows a schematic view of an embodiment of a multi-station processing tool 500 with an inbound load lock 502 and an outbound load lock 504, either or both of which may comprise a remote plasma source. A robot 506, at atmospheric pressure, is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 comprises a remote plasma source, the wafer may be exposed to a remote plasma treatment in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 comprises four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 514 may include one or more matched pairs of ALD and plasma-enhanced ALD process stations. While the depicted processing chamber comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system 590 for transferring wafers within processing chamber 514. In some embodiments, wafer handling system 590 may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., silane, nitrogen, and purge gases as described herein) and flow rates and optionally for flowing gas into one or more process stations prior to deposition in order to stabilize the pressure in the process station. For example, a process gas control program may include code for changing duration of process gas doses across cycles in a multi-cyclic ALD process. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein. For example, a plasma control program may include code for varying RF power levels across cycles.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameter values adjusted by system controller 550 may relate to process conditions. Non-limiting examples include process gas composition and flow rates and dose times, temperature, pressure, plasma conditions (such as RF power levels), and variation of one or more parameter values across ALD cycles, etc. These parameter values may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameter values to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller. The controller 550 may have any of the features described above with respect to FIG. 4.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted on two silicon oxide films to determine the wet etch rate of each. Both silicon oxide films were deposited into features having an aspect ratio of 7:1. Both silicon oxide films were deposited by atomic layer deposition using alternating pulses of a silicon precursor and a mixture of oxygen and nitrous oxide which used to generate a plasma using a power of 5000 W. Argon and nitrogen gas were also flowed during deposition. The flow rate of oxygen was 5000 sccm, the flow rate of nitrous oxide was 5000 sccm, the flow rate of argon was sccm, and the flow rate of nitrogen was 25000 sccm. A carrier gas was used having a flow rate of 1500 sccm. The pulses of plasma used during ALD had a duration of 0.3 seconds and the film was deposited into a chamber having a pressure of 6 Torr.

The first silicon oxide film was deposited without an intermittent plasma treatment and wet etch rate was determined for the top, middle, and bottom of the feature. The measured wet etch rates in 100:1 hydrofluoric acid for 30 seconds are graphed in FIG. 6 as the solid bars.

The second silicon oxide film was deposited with an intermittent plasma treatment by flowing oxygen gas, argon, helium, and hydrogen gas and generating a plasma at a power of 1500 W for 10 seconds in a 2 Torr chamber. The flow rate of oxygen gas was 2000 sccm, the flow rate of argon was 3200 sccm, the flow rate of helium was 2000 sccm, and the flow rate of hydrogen was 2000 sccm. The intermittent plasma treatment was performed every 5 cycles of ALD. The measured wet etch rates in 100:1 hydrofluoric acid for 30 seconds for the top, middle, and bottom of the features is graphed in FIG. 6 as the diagonally shaded bars.

Figure 6:
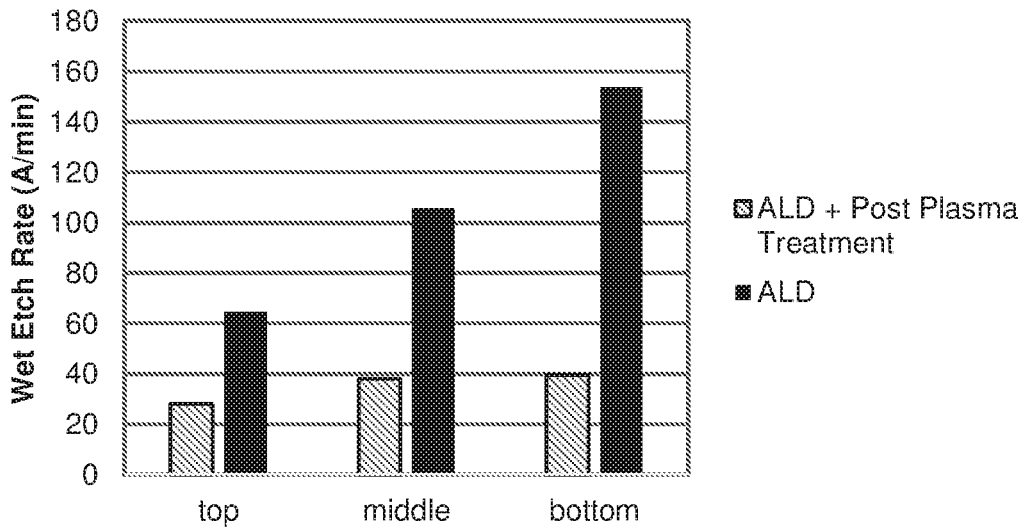
FIG. 6 is a graph showing in-feature wet etch rate at the top, middle, and bottoms of features for various films.

As shown in FIG. 6, the wet etch rate of the film that was subject to intermittent plasma treatment achieved substantially lower wet etch rate than the film without intermittent plasma treatment.

Experiment 2

An experiment was conducted on seven different films. Each film was deposited by atomic layer deposition using cycles of silicon precursor exposure, purge, oxygen and nitrous oxide gas mixture with 1250 W plasma, and purge. Argon and nitrogen gas were used as inert carrier gases and were used during the purge. The oxygen gas flow rate was 5000 sccm, the nitrous oxide gas flow rate was 5000 sccm, the argon gas flow rate was 5000 sccm, and the nitrogen gas flow rate was 25000 sccm. The carrier flow rate was 1500 sccm. The plasma used during oxygen and nitrogen gas exposure was turned on for a duration of 0.3 seconds. ALD was performed using a chamber pressure of 6 Torr.

Figure 7:
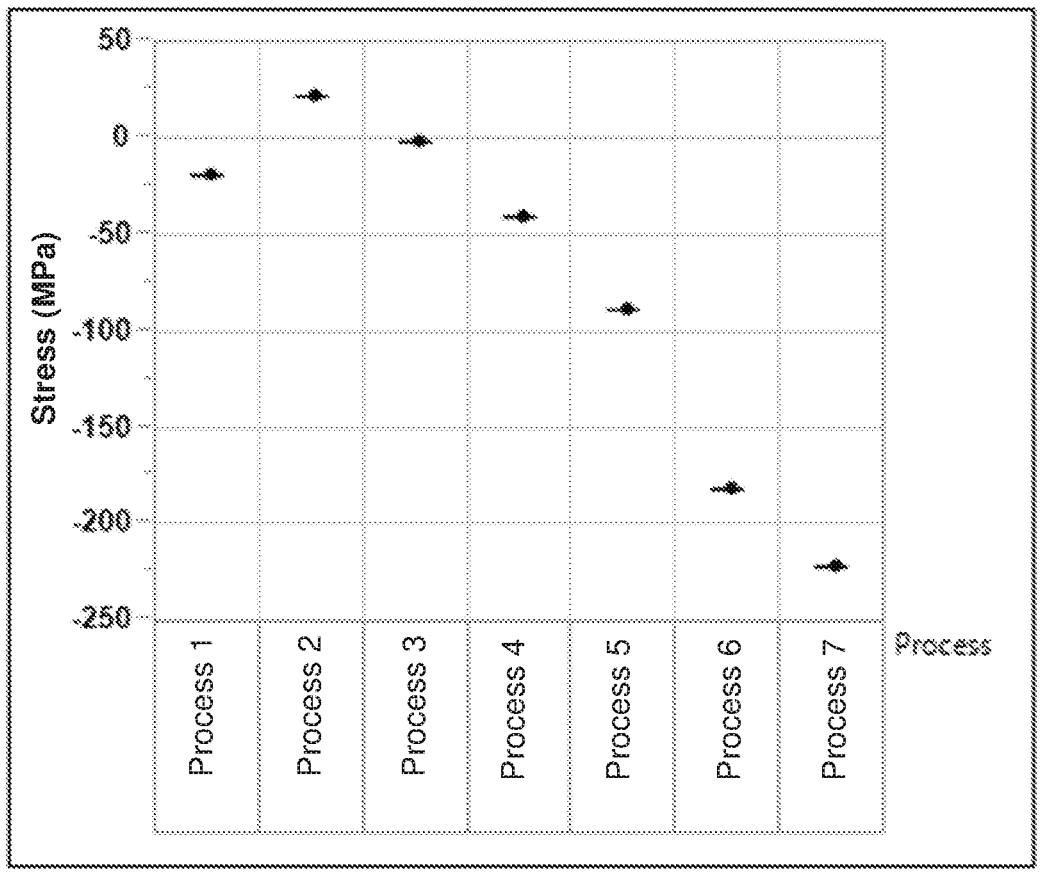
FIG. 7 is a graph showing stress of films deposited using different processes.

The first silicon oxide film was deposited by this ALD process with no intermittent plasma treatment and the stress was measured for the film and depicted in FIG. 7 as Process 1.

The second through seventh silicon oxide films were deposited by this ALD process with intermittent plasma treatment every 10 cycles and is depicted in Process 2-7 in FIG. 7. The process conditions for each of these processes are provided in Table I below. Pressure during intermittent plasma treatment for all processes was 10 Torr and RF ON time was 10 seconds. For the cyclic processes 4 and 7, the RF was ON for 10 seconds, then off, for 100 cycles of pulsed plasma treatment.

TABLE 1

| Process Conditions for Processes 2-7 | | | | | | | |
|---|---|---|---|---|---|---|---|
| | RF | RF | Flow Rate (sccm) | | | | |
| Process | Frequency | Power | O2 | He | H2 | Ar | Pulsed? |
| 2 | 13.56 MHz | 1250 W | 2000 | 2000 | 2000 | 0 | No |
| 3 | 13.56 MHz | 1250 W | 2000 | 2000 | 2000 | 10000 | No |
| 4 | 13.56 MHz | 1250 W | 2000 | 20000 | 2000 | 1200 | Yes, 100 cycles of ON/OFF |
| 5 | 13.56 MHz | 1250 W | 2000 | 2000 | 2000 | 10000 | No |
| 6 | 13.56 MHz | 2500 W | 2000 | 2000 | 2000 | 10000 | Yes, 100 cycles of |

TABLE 1-continued

Process Conditions for Processes 2-7

| Process | RF Frequency | RF Power | Flow Rate (sccm) | | | | Pulsed? |
|---|---|---|---|---|---|---|---|
| | | | O2 | He | H2 | Ar | |
| 7 | 13.56 MHz/ 440 kHz | 1250 W | 2000 | 2000 | 2000 | 10000 | ON/OFF No |

The results show that the stress of the film can be modulated by toggling various process conditions of the intermittent plasma treatment alone, including varying the RF frequency, RF power, helium flow rate, argon flow rate, and pulsing scheme.

Experiment 3

An experiment was conducted on silicon oxide films deposited by atomic layer deposition involving cycles of silicon precursor dose, purge, oxygen and nitrous gas plasma (with argon and nitrogen gas), and purge. The plasma was generated using 1250 W plasma power for 0.3 seconds and carrier gas flow was used at a flow rate of 1500 sccm. The oxygen gas flow rate was 5000 sccm, the nitrous oxide gas flow rate was 5000 sccm, the argon flow rate was 5000 sccm, and the nitrogen gas flow rate was 25000 sccm. The chamber pressure was 6 Torr-.

The films were subject to fluorine-based inhibition by using a dual frequency plasma generated at 750 W for the high frequency plasma, 1000 W for the low frequency plasma, ignited in an environment having 500 sccm of oxygen gas, 3200 sccm of argon gas, 6000 sccm of helium gas, and 35 sccm of nitrogen trifluoride gas flowed therein for 1 second.

Figure 8:
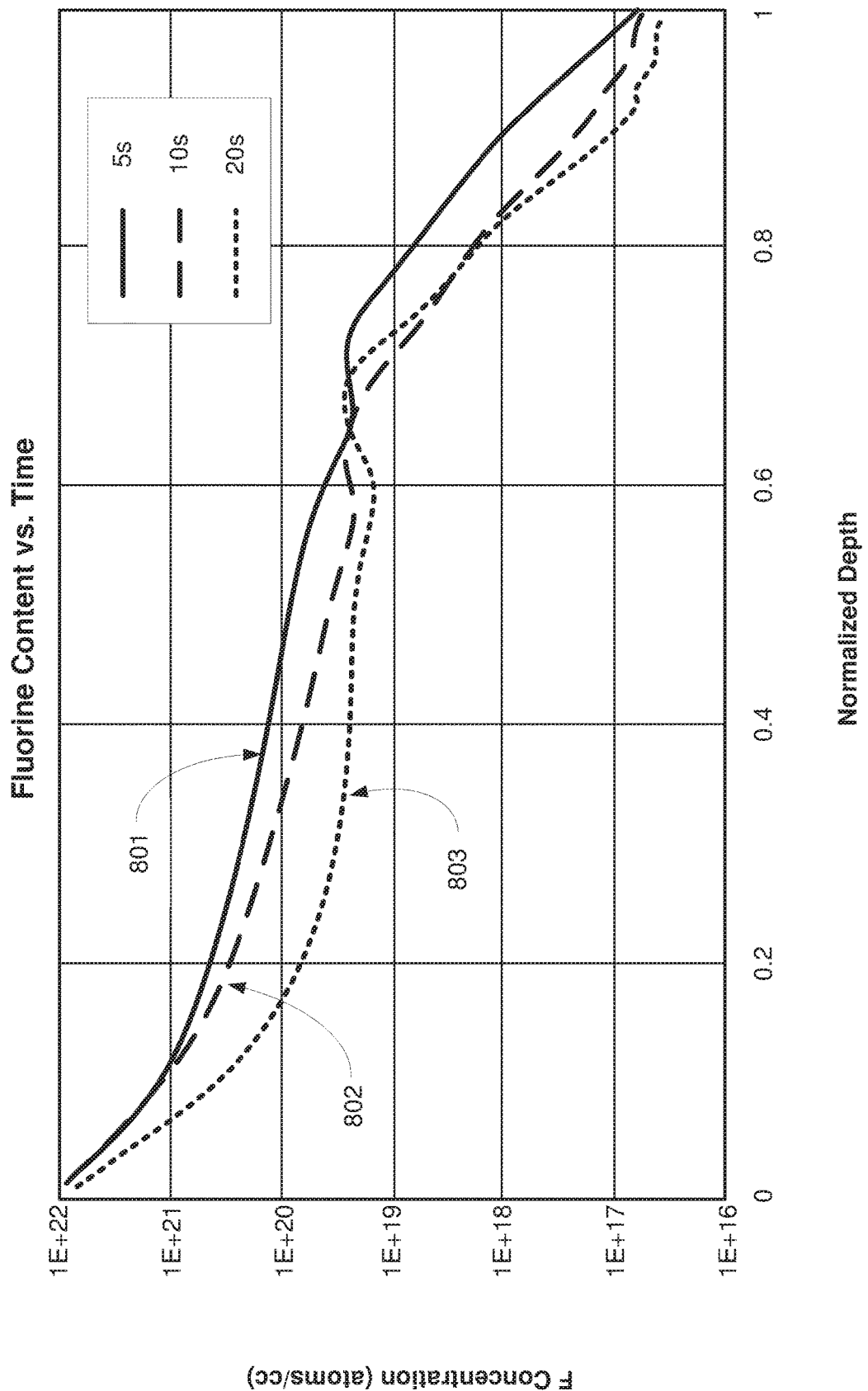
FIG. 8 is a graph depicting fluorine concentration of films exposed to varying durations of plasma as a function of normalized depth.

The films were then subject to intermittent plasma treatments of different durations. The intermittent plasma treatment involved exposing the substrate to 2000 sccm of oxygen, 3200 sccm of argon, 2000 sccm of helium, and 2000 of hydrogen in a chamber having a pressure of 2 Torr ignited using 1500 W of plasma. The three different intermittent plasma treatment durations were seconds, 10 seconds and 20 seconds. The intermittent plasma treatment was performed every cycles of ALD. The fluorine concentration was determined for each of these films as a function of normalized depth of the film which is graphed in FIG. 8. Line 801 refers to the 5 second intermittent plasma treatment results, line 802 refers to the 10 second intermittent plasma treatment results, and line 803 refers to the 15 second intermittent plasma treatment results. The results suggest that longer post plasma treatment can be used to reduce fluorine concentration in the silicon oxide film deposited using ALD with inhibition.

Experiment 4

An experiment was conducted to measure the k value of silicon oxide films deposited by ALD for a film without and a film with intermittent plasma treatment. The experiment also involved determining the breakdown field for both films.

These films were deposited using multiple cycles of a silicon precursor exposure, purge, oxygen and nitrous oxide plasma exposure (with argon and nitrogen) and purge. The plasma was generated using a plasma power of 1250 W for 0.3 seconds. The flow rate of oxygen gas was 5000 sccm, the flow rate of nitrous oxide gas was 5000 sccm, the flow rate of argon gas was 5000 sccm, the flow rate of nitrogen gas was 25000 sccm, and the carrier flow was 1500 sccm. The chamber pressure was 6 Torr.

Figure 9:
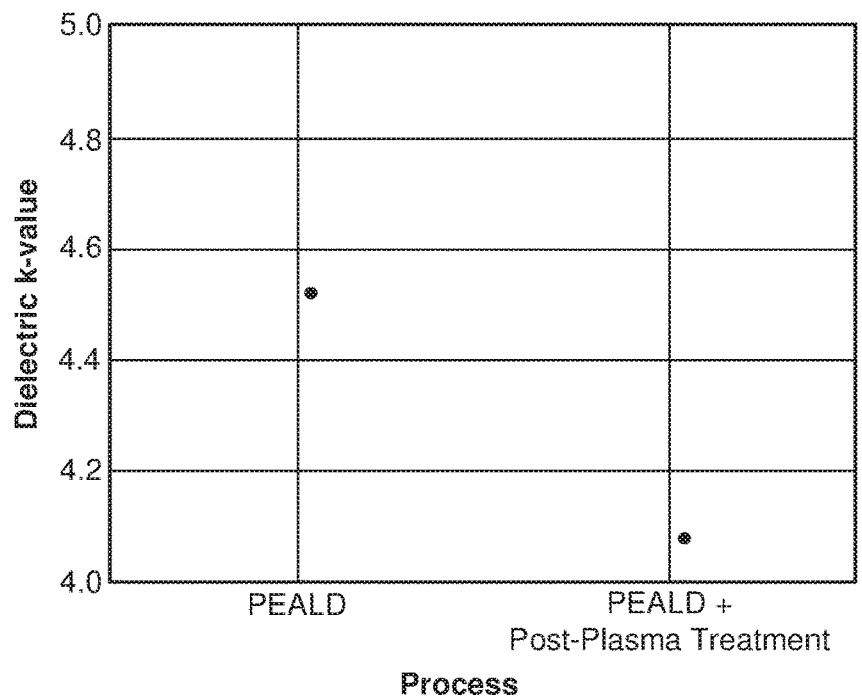
FIG. 9 is a graph depicting dielectric k-values for a film deposited by plasma-enhanced atomic layer deposition (PEALD) and a film deposited by PEALD with intermittent plasma treatment.
Figure 10:
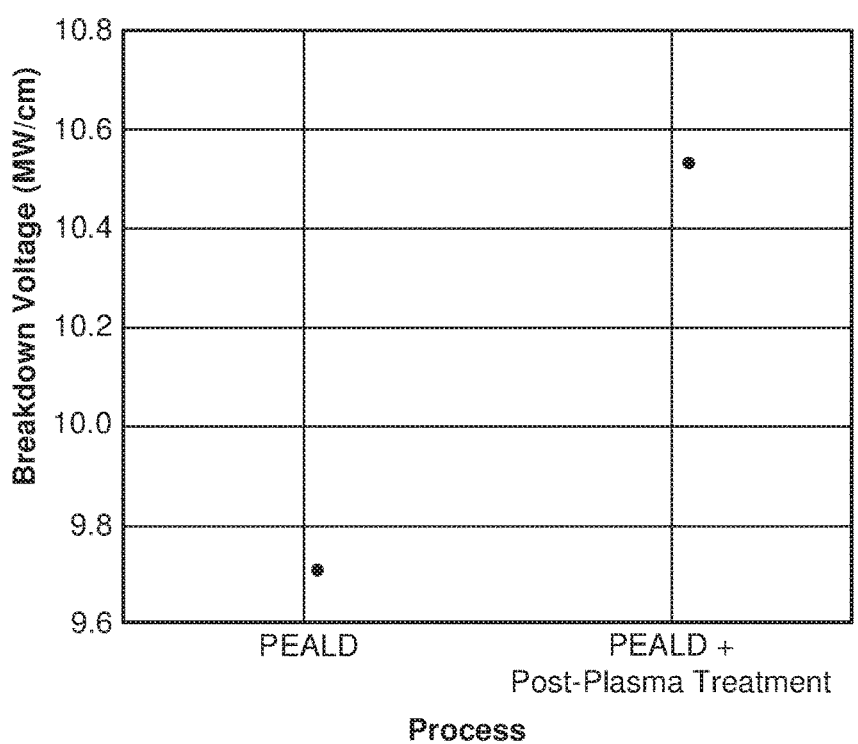
FIG. 10 is a graph depicting breakdown voltage of a film deposited by plasma-enhanced atomic layer deposition (PEALD) and a film deposited by PEALD with intermittent plasma treatment.

The film deposited using this process without intermittent plasma treatment was evaluated for dielectric k value (FIG. 9) and breakdown field (FIG. 10).

The other film was exposed to intermittent plasma treatment after the deposition of the film, whereby the intermittent plasma treatment involved exposure to a 1250 W plasma for 10 seconds generated from igniting 2000 sccm of oxygen, 3200 sccm of argon, 2000 sccm of helium, and 2000 sccm of hydrogen for every 10 cycles of ALD. The film deposited using the above process with intermittent plasma treatment was evaluated for dielectric k value (FIG. 9) and breakdown field (FIG. 10).

As shown in FIG. 9, the dielectric k value for the film exposed to intermittent plasma treatment was substantially lower than that of the film not exposed to intermittent plasma treatment. The breakdown voltage for the film exposed to intermittent plasma treatment was substantially higher than that of the film not exposed to intermittent plasma treatment. These results suggest superior results for a film deposited using the intermittent plasma treatment versus without.

Experiment 5

Figure 11:
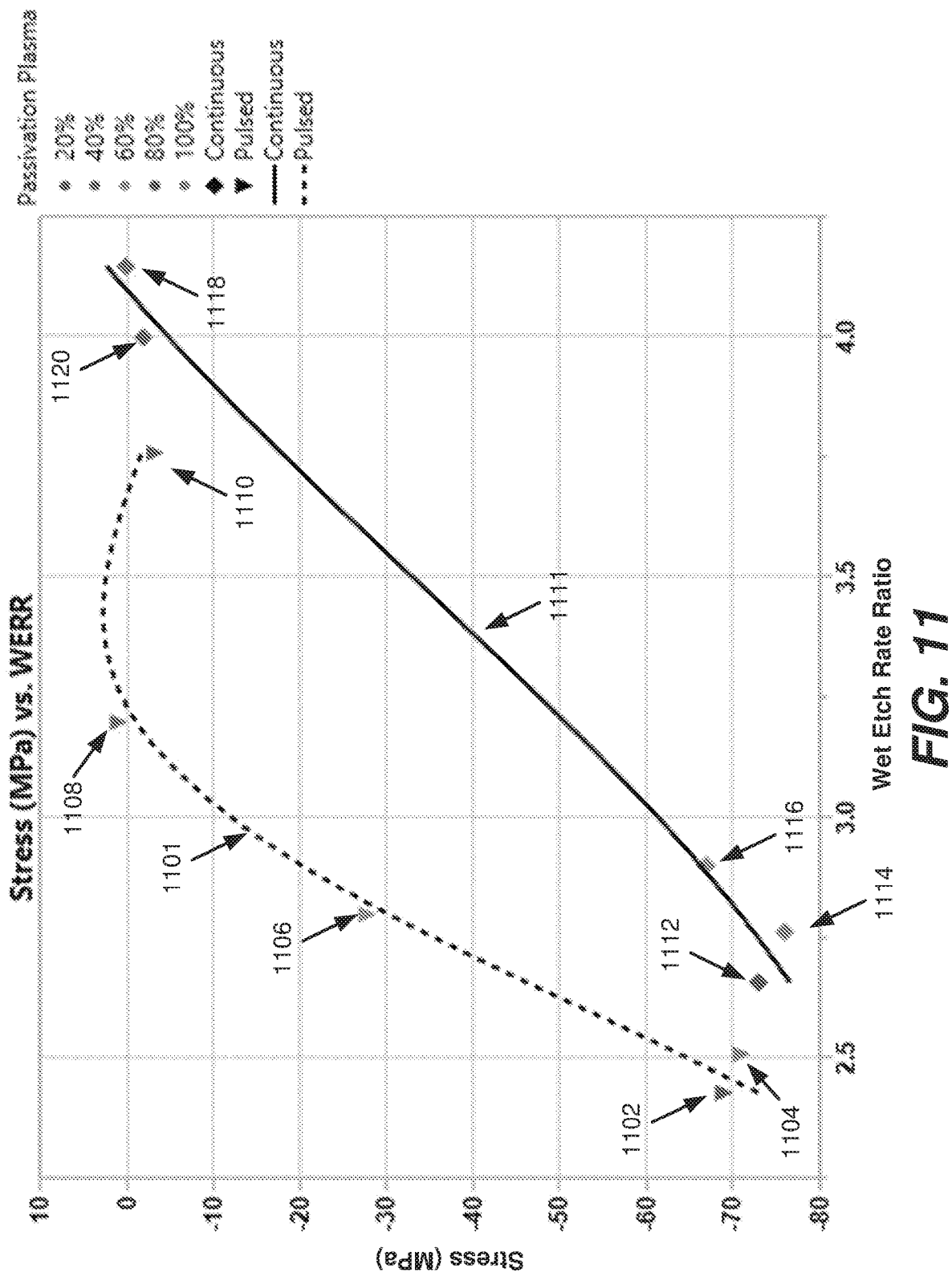
FIG. 11 is a graph depicting stress and wet etch rate of films treated with pulsed and continuous intermittent plasma treatment.

An experiment was conducted comparing stress and wet etch rate of films deposited and treated using continuous versus pulsed plasma. FIG. 11 shows a graph depicting variation in film stress versus wet etch rate by modifying the percent argon flow and type of plasma applied during treatment. Pulsed plasma was performed at a frequency of 10 Hz. The percentage of argon flow is a percentage of the total available argon flow into the chamber.

Point 1102 represents 80% argon flow with pulsed plasma; point 1104 represents 100% argon flow with pulsed plasma; point 1106 represents 60% argon flow with pulsed plasma; point presents 40% argon flow with pulsed plasma; point 1110 represents 20% argon flow with pulsed plasma; and line 1101 represents the overall curve and trend of stress with wet etch rate when treated with pulsed plasma.

In comparison, point 1112 represents 80% argon flow with continuous plasma; point represents 100% argon flow with continuous plasma; point 1116 represents 60% argon flow with continuous plasma; point 1118 represents 40% argon flow with continuous plasma; point represents 20% argon flow with continuous plasma; and line 1111 represents the overall curve and trend of stress and wet etch rate of a film treated with continuous plasma.

As shown, the results are surprising, since the trend for continuous plasma is different from that of pulsed plasma, which appears to have favorable results of both substantially reduced stress and reduced wet etch rate at 40% argon flow and pulsed plasma, whereas the 40% argon flow and continuous plasma achieved the highest wet etch rate compared to all of the other points. The differentiation shown is distinct, and unexpected, given known trends of stress and wet etch rate for various films.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for processing substrates, the method comprising:
   providing a semiconductor substrate to a reaction chamber;
   performing cycles of atomic layer deposition to deposit a film, each cycle comprising:
      introducing a first reactant in vapor phase into the reaction chamber to adsorb the first reactant onto a surface of the semiconductor substrate;
      introducing a dose of a second reactant in vapor phase into the reaction chamber for a dose time; and
      generating a first plasma in the reaction chamber while the second reactant in vapor phase is in the reaction chamber; and
   after every n cycles of the atomic layer deposition, exposing the film to a second plasma generated from flowing argon and a second gas,
   wherein either
      (1) the second gas is selected from the group consisting of hydrogen, oxygen, and combinations thereof and a ratio of flow rate of argon to the second gas is between about 50:1 and about 1:1, or
      (2) the second gas is nitrous oxide and a ratio of flow rate of argon to the second gas is between about 10:1 and about 20:1, and
      wherein the second plasma is pulsed between an ON and OFF state during the exposing of the film to the second plasma.

2. The method of claim 1, further comprising flowing one or more additional gases during the exposing of the film to the second plasma, the one or more additional gases selected from the group consisting of oxygen, nitrous oxide, and helium.

3. The method of claim 1, wherein the second plasma is generated at a power between about 750 W and about 1625 W per substrate.

4. The method of claim 1, wherein the film comprises silicon oxide.

5. The method of claim 1, wherein the exposing of the film to the second plasma and the performing of the cycles of the atomic layer deposition are performed without breaking vacuum.

6. A method for processing substrates, the method comprising:
   providing a semiconductor substrate to a reaction chamber;
   performing cycles of atomic layer deposition to deposit a film, each cycle comprising:
      introducing a first reactant in vapor phase into the reaction chamber to adsorb the first reactant onto a surface of the semiconductor substrate;
      introducing a dose of a second reactant in vapor phase into the reaction chamber for a dose time; and
      generating a first plasma in the reaction chamber while the second reactant in vapor phase is in the reaction chamber; and
   after every n cycles of the atomic layer deposition, exposing the film to a second plasma generated from flowing argon and a second gas having an argon to second gas flow rate ratio of between about 50:1 and about 1:1 to achieve a wet etch rate of less than about 40 A/min in 100:1 HF, and
   wherein the second plasma is pulsed between an ON and OFF state during the exposing of the film to the second plasma.

7. The method of claim 6, wherein the second gas is selected from the group consisting of hydrogen and oxygen and combinations thereof.

8. The method of claim 6, further comprising flowing a third gas during the exposing of the film to the second plasma, wherein the third gas is selected from the group consisting of nitrous oxide, helium, and combinations thereof.

9. The method of claim 8, wherein ratio of flow rate of argon to flow rate of the third gas is between about 10:1 and about 20:1.

* * * * *